United States Patent
Cooper et al.

(10) Patent No.: US 6,480,261 B2
(45) Date of Patent: Nov. 12, 2002

(54) PHOTOLITHOGRAPHIC SYSTEM FOR EXPOSING A WAFER USING A PROGRAMMABLE MASK

(75) Inventors: Gregory D. Cooper, Greenbelt, MD (US); Richard M. Mohring, Wheaton, MD (US)

(73) Assignee: Pixelligent Technologies LLC, Alexandria, VA (US)

( * ) Notice: Subject to any disclaimer, the term of this patent is extended or adjusted under 35 U.S.C. 154(b) by 0 days.

(21) Appl. No.: 09/871,971

(22) Filed: Jun. 4, 2001

(65) Prior Publication Data

US 2002/0027647 A1 Mar. 7, 2002

Related U.S. Application Data

(62) Division of application No. 09/066,979, filed on Apr. 28, 1998, now Pat. No. 6,291,110.
(60) Provisional application No. 60/051,121, filed on Jun. 27, 1997, provisional application No. 60/058,701, filed on Sep. 12, 1997, provisional application No. 60/058,702, filed on Sep. 12, 1997, and provisional application No. 60/060,254, filed on Sep. 29, 1997.

(51) Int. Cl.[7] .................... G03B 27/42; G03B 27/32; H04N 1/04; A61N 5/00; G03F 9/00
(52) U.S. Cl. .................... 355/53; 355/27; 355/40; 355/38; 355/39; 355/72; 358/487; 358/506; 250/492.2; 250/492.22; 430/5
(58) Field of Search .................... 355/53, 27, 40, 355/38, 72, 39; 358/487, 506; 250/492.2, 492.22; 430/5

(56) References Cited

U.S. PATENT DOCUMENTS 3,445,827 A   5/1969   Keyes (List continued on next page.)

FOREIGN PATENT DOCUMENTS

EP   0 552 953 A1   7/1993
GB   2 133 618   7/1984

(List continued on next page.)

OTHER PUBLICATIONS

Kuwamura, Yuji et al., "Panel–Type Semiconductor Optical Modulator Using Electron Depleting Absorption Control," Jpn. J. App. Phys. vol. 32 (1993) pp 578–582, Part 1, No. 1B, Jan. 1993.

(List continued on next page.)

*Primary Examiner*—Russell Adams
*Assistant Examiner*—Khaled Brown
(74) *Attorney, Agent, or Firm*—Nixon & Vanderhye P.C.

(57) ABSTRACT

The present invention overcomes many of the disadvantages of prior lithographic microfabrication processes while providing further improvements that can significantly enhance the ability to make more complicated semiconductor chips at lower cost. A new type of programmable structure for exposing a wafer allows the lithographic pattern to be changed under electronic control. This provides great flexibility, increasing the throughput and decreasing the cost of chip manufacture and providing numerous other advantages. The programmable structure consists of an array of shutters that can be programmed to either transmit light to the wafer (referred to as its "open" state) or not transmit light to the wafer (referred to as its "closed" state). The programmable structure can comprise or include an array of selective amplifiers. Thus, each selective amplifier is programmed to either amplify light (somewhat analogous to the "open" or "transparent" state of a shutter) or be "non-amplifying" (its "closed" or "opaque" state). In the non-amplifying state, some portion of the incident light is transmitted through the amplifier material. The shutters and selective amplifiers can work in tandem to form a "programmable layer". A programmable technique is provided for creating a pattern to be imaged onto a wafer that can be implemented as a viable production technique. Thus, the present invention also provides a technique of making integrated circuits. A diffraction limiter can be used to provide certain advantages associated with contact lithography without requiring some of the disadvantages of contact lithography.

35 Claims, 26 Drawing Sheets

U.S. PATENT DOCUMENTS

| | | | |
|---|---|---|---|
| 3,512,041 A | | 5/1970 | Dalmasso |
| 3,543,031 A | | 11/1970 | Kazan et al. |
| 3,704,052 A | | 11/1972 | Coleman |
| 3,982,239 A | | 9/1976 | Sherr |
| 4,050,814 A | | 9/1977 | McFadden |
| 4,193,183 A | | 3/1980 | Klein |
| 4,586,053 A | | 4/1986 | Hughes |
| 4,644,342 A | | 2/1987 | Abbas |
| 4,653,860 A | | 3/1987 | Hendrix |
| 4,985,897 A | | 1/1991 | Botez et al. |
| 5,045,419 A | | 9/1991 | Okumura |
| 5,078,474 A | | 1/1992 | Marui et al. |
| 5,082,755 A | * | 1/1992 | Liu ........................ 430/5 |
| 5,138,368 A | | 8/1992 | Kahn et al. |
| 5,253,011 A | * | 10/1993 | Zahn et al. |
| 5,278,629 A | | 1/1994 | Schlager et al. |
| 5,343,271 A | | 8/1994 | Morishige |
| 5,362,940 A | | 11/1994 | MacDonald et al. |
| 5,374,974 A | | 12/1994 | Rostoker et al. |
| 5,412,595 A | | 5/1995 | Shannon |
| 5,451,766 A | | 9/1995 | Van Berkel |
| 5,502,585 A | | 3/1996 | Qian |
| H1525 H | | 4/1996 | Geil et al. |
| 5,509,553 A | | 4/1996 | Hunter, Jr. et al. |
| 5,527,645 A | * | 6/1996 | Pati et al. |
| 5,643,700 A | * | 7/1997 | Otsuka |
| 5,660,738 A | | 8/1997 | Hunter, Jr. et al. |
| 5,686,979 A | | 11/1997 | Weber et al. |
| 5,691,541 A | | 11/1997 | Ceglio et al. |
| 5,705,322 A | * | 1/1998 | West et al. |
| 5,742,362 A | * | 4/1998 | Chikamichi |
| 5,858,577 A | * | 1/1999 | Lee et al. |
| 6,291,110 B1 | * | 9/2001 | Cooper et al. |

FOREIGN PATENT DOCUMENTS

| | | |
|---|---|---|
| JP | 60-161690 | 8/1985 |
| JP | 61-212825 | 9/1986 |
| JP | 62-097387 | 6/1987 |
| JP | 62-164001 | 7/1987 |
| JP | 62-209886 | 9/1987 |
| JP | 63-062390 | 3/1988 |
| JP | 63-181391 | 7/1988 |
| JP | 63-223614 | 9/1988 |
| JP | 63-228795 | 9/1988 |
| WO | WO91/10170 | 7/1991 |

OTHER PUBLICATIONS

Paufler et al., "High–throughput optical direct write lithography,", *Solid State Technology*, pp. 175,176, 178, 180, 182 (jun. 1997).

Binet, F. et al., "Electric field effects on excitons in gallium nitride," *Physical Review B*, vol. 54, No. 11 (Sep. 15, 1996).

* cited by examiner

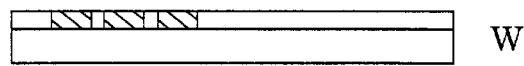 W  Fig. 13B
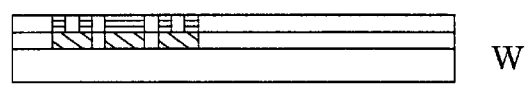 W  Fig. 13C
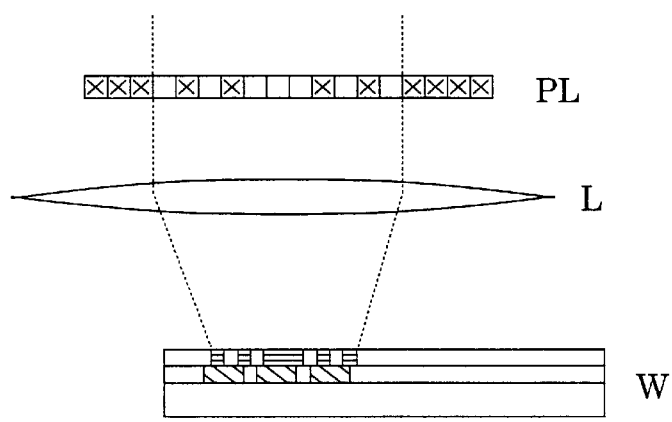 PL  L  W  Fig. 13D
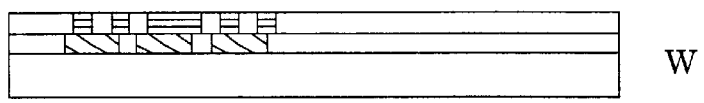 W  Fig. 13E

# PHOTOLITHOGRAPHIC SYSTEM FOR EXPOSING A WAFER USING A PROGRAMMABLE MASK

CROSS-REFERENCE TO RELATED APPLICATION

This is a divisional of application Ser. No. 09/066,979, filed Apr. 28 1998, now U.S. Pat. No. 6,291,110, the entire contents of which is hereby incorporated by reference herein.

This application claims the benefit of U.S. Provisional Application No. 60/051,121 filed Jun. 27, 1997 entitled "A Shutter For a Programmable Photon Lithography Mask"; U.S. Provisional Application No. 60/058,701 filed Sep. 12, 1997 entitled "A Doped Solid-State Lithography Mask"; U.S. Provisional Application No. 60/058,702 filed Sep. 12, 1997 entitled "A Device to Improve Resolution In Lithography Using A Programmable Mask"; and U.S. Provisional Application No. 60/060,254 filed Sep. 29, 1997 entitled "A Selective Amplifier For a Programmable Photon Lithography Mask."

FIELD OF THE INVENTION

This invention relates to microfabrication, and more particularly to systems, methods, and techniques for manufacturing integrated circuit chips using photon lithography. Still more particularly, the present invention relates to systems, methods, and techniques in connection with programmable masks for microlithography.

BACKGROUND AND SUMMARY OF THE INVENTION

Lithography is used to transfer a specific pattern onto a surface. Lithography can be used to transfer a variety of patterns including, for example, painting, printing, and the like. More recently, lithographic techniques have become widespread for use in "microfabrication"—a major example of which is the manufacture of integrated circuits such as computer chips.

In a typical microfabrication operation, lithography is used to define patterns for miniature electrical circuits. The lithography defines a pattern specifying the location of metal, insulators, doped regions, and other features of a circuit printed on a silicon wafer or other substrate. The resulting semiconductor circuit can perform any of a number of different functions.

Improvements in lithography have been mainly responsible for the explosive growth of computers in particular and the semiconductor industry in general. The major improvements in lithography can, for the most part, be put into two categories: an increase in chip size, and a decrease in the minimum feature size (improvement in resolution). Both of these improvements allow an increase in the number of transistors on a single chip (and in the speed at which these transistors can operate). For example, the computer circuitry that would have filled an entire room in 1960's technology can now be placed on a silicon "die" the size of your thumbnail. A device the size of a wristwatch can contain more computing power than the largest computers of several decades ago.

One type of lithography that is commonly used in the mass production of computer chips is known as "parallel lithography". Parallel lithography generally prints an entire pattern at one time. This is usually accomplished by projecting photons through a mask onto a photoresist-coated semiconductor wafer, as shown in FIG. 1. A mask (designated by an "M" in FIG. 1) provides a template of the desired circuit. A photoresist coat, which may be a thin layer of material coated on the wafer which changes its chemical properties when impinged upon by light, is used to translate or transfer the mask template onto the semiconductor wafer. In more detail, mask M allows photons (incident light, designated by an "I") to pass through the areas defining the features but not through other areas. An example of a typical mask construction would be deposits of metal on a glass substrate. In a way analogous to the way light coming through a photographic negative exposes photographic paper, light coming through the mask exposes the photoresist. The exposed photoresist bearing the pattern selectively "resists" a further process (e.g., etching with acid, bombardment with various particles, deposition of a metallic or other layer, etc.) Thus, this lithography technique using photoresist can be used to effectively translate the pattern defined by the mask into a structural pattern on the semiconductor wafer. By repeating this technique several times on the same wafer using different masks, it is possible to build multi-layered semiconductor structures (e.g., transistors) and associated interconnecting electrical circuits.

Parallel lithography as described above has the advantage that it is possible to achieve a high throughput since the whole image is formed at once. This makes parallel lithography useful for mass production. However, parallel lithography has the disadvantage that a new mask is required each time one desires to change patterns. Because masks can have very complex patterns, masks are quite costly and susceptible to damage.

For mass production, parallel lithography is usually done using a machine known as a "stepper." As schematically depicted in FIG. 1, a stepper consists of a light source ("L"), a place to hold a mask ("W"), an optical system ("lenses", "L") for projecting and demagnifying the image of the mask onto a photoresist-coated wafer ("W"), and a stage ("S") to move the wafer. The process of exposing a wafer using a stepper is summarized in FIG. 2A, and is depicted from a side view in FIGS. 2B–2E. In each exposure, a stepper only exposes a small part of the wafer, generally the size of one chip. Since there are often many separate chips on each wafer, the wafer must be exposed many times. The stepper exposes the first chip (FIG. 2B), then moves ("steps") over (FIG. 2C) to expose the next chip (FIG. 2D) and repeats this process (FIG. 2E) until the entire wafer is exposed. This process is known as "step and repeat" and is the origin of the name "stepper."

A stepper must also be capable of precisely positioning the wafer relative to the mask. This precise positioning (overlay accuracy) is needed because each lithography step must line up with the previous layer of lithography. A stepper spends a significant portion of its time positioning the stage and the rest exposing the photoresist. Despite the great precision necessary, steppers must be capable of high throughput to be useful for mass production. There are steppers that can process one hundred 8-inch wafers per hour.

One way to increase the usefulness of a chip is to increase its size. In the "step and repeat" example described above, the size of the chip is limited to the exposure size of the stepper. The exposure size is small (roughly 20 mm×40 mm) because of the cost of an optical system that is capable of projecting a high quality image of the mask onto the wafer. It is very expensive to increase the size of a chip by increasing the exposure size of the stepper (for example, this would require a larger lens—which by itself can cost many hundreds of thousands of dollars). Another approach is to modify a stepper so that light only shines on a subsection of the mask at a given time. Then, the mask and wafer can be scanned (moved relative to the fixed light source) simultaneously until the entire mask is imaged onto the wafer, as in FIGS. 3A–3C. This modified stepper is known as a "scanner" or "scanner/stepper".

Scanners offer increased chip size at the expense of increased complexity and mask costs. Because scanner masks are larger, the masks are more fragile and are more likely to contain a defect. The increased size and fragility of the mask mean that the masks for a scanner will be more expensive than the masks for a stepper. Also, because the image is being demagnified, the mask and wafer must be scanned at different speeds, as depicted by the length of the arrows in FIGS. 3A–3C. Because of the great precision required, differential scanning increases the cost and complexity of a scanner when compared with a stepper.

Many chip manufacturers are looking toward future improvements in resolution and/or exposure size to help continue the growth that has driven the semiconductor industry for the past thirty years. The improvements in these areas have been partly the result of improvements in the optical systems used to demagnify the mask and of the use of shorter wavelength light. In particular, modem lithography systems used for mass production are "diffraction limited", meaning that the smallest feature size that it is possible to print is determined by the diffraction of light and not by the size of features on the mask. In order to improve the resolution, one must use either a shorter wavelength of light or another technique such as optical proximity correction or phase shifting.

Another option for improving resolution is to put the mask in contact with the wafer, as in FIG. 4; the effects of diffraction can be lessened by not giving the light a chance to "spread out" after it passes through the mask. Unfortunately, contact lithography is not suitable for mass production for at least two reasons. First, the mask must now be the same size as the final pattern, making the mask more expensive and more fragile. Second, because the mask is in contact with the wafer, it is easily damaged.

The present invention overcomes many of the disadvantages of prior lithographic microfabrication processes while providing further improvements that can significantly enhance the ability to make more complicated semiconductor chips at lower cost.

One aspect provided by this invention provides a new type of programmable structure for exposing a wafer. The programmable structure allows the lithographic pattern to be changed under electronic control. This provides great flexibility, increasing the throughput and decreasing the cost of chip manufacture and providing numerous other advantages.

The programmable structure provided in accordance with one example embodiment of the invention consists of an array of shutters that can be programmed to either transmit light to the wafer (referred to as its "open" state) or not transmit light to the wafer (referred to as its "closed" state). A simplified example lithography system incorporating such a programmable mask is schematically depicted in FIG. 5A exposing an example pattern. In FIG. 5B the same programmable mask PPM is shown exposing a different pattern.

The programmable mask shown in FIGS. 5A and 5B can provide a two-dimensional array of individual shutters each of which can be programmed to either transmit light ("open", "transparent") or block light ("closed", "opaque").

At least one such two-dimensional array of structures can be placed between a wafer and a source of electromagnetic energy. Each of the structures may comprise an active region supporting an electron distribution that can be changed to affect the modulation of electromagnetic energy from said source. The structures can be controlled to selectively modulate, in accordance with a programmable pattern, electromagnetic energy impinging on the wafer.

In accordance with this aspect provided by the invention, a system for exposing a wafer may comprise a source of electromagnetic energy, a collimating lens optically coupled to the electromagnetic energy source, a wafer stage, and a two-dimensional array of structures disposed between the wafer stage and the collimating lens. Each of the structures in the array may comprise an active region supporting an electron distribution that can be changed to affect the modulation of electromagnetic energy from said source. An electrical controller coupled to the two-dimensional array may be used to electrically control the semiconductor structures to selectively modulate, in accordance with a changeable pattern, electromagnetic energy from the source that is directed toward the wafer stage.

In accordance with a further aspect provided by the present invention, the programmable structure can comprise or include an array of selective amplifiers. In accordance with this aspect provided by the invention, a programmable electromagnetic energy modulating structure comprises a two-dimensional array of solid-state selective amplifiers each comprising regions of permanently opaque material and active regions. Control circuitry disposed within the array can be provided to selectively control each of the active regions to toggle between an amplifying state and a non-amplifying state. Thus, each selective amplifier is programmed to either amplify light (somewhat analogous to the "open" or "transparent" state of a shutter) or be "non-amplifying"(its "closed" or "opaque" state). In the non-amplifying state, some portion of the incident light is transmitted through the amplifier material. The portion incident light that is transmitted through the amplifier can range from 0–100%, depending on the specific design and operating conditions. Selective amplification has all of the advantages of a programmable structure that uses shutters with several added advantages—including reduction in the time required to expose the resist.

In accordance with a further aspect provided by the invention the shutters and selective amplifiers can work in tandem to form a "programmable layer". When the programmed pattern calls for light to pass (or, not pass) through a particular pixel, both the selective amplifier and shutter corresponding to that pixel would be put into their open (or, closed) state. FIGS. 6A–6F schematically depicts the operation of an example shutter (labeled as "SH") (FIGS. 6A–6B), an example selective amplifier (labeled as "AM") (FIGS. 6C–6D), and an example device (labeled as "X") combining the two (FIGS. 6E–6F). In each of these figures, "I" represents the intensity of light incident on the shutter/amplifier, and "I'" represents the light intensity after interacting with the shutter/amplifier. Combining a selective amplifier with a shutter in this manner achieves increased contrast over selective amplification alone.

In accordance with another aspect provided by the present invention, a programmable technique is provided for creating a pattern to be imaged onto a wafer that can be implemented as a viable production technique. Thus, the present invention also provides a technique of making integrated circuits. In accordance with this aspect provided by the invention, a wafer having a surface covered with photoresist is placed on a movable wafer stage. A source directs electromagnetic energy toward a two-dimensional array of semiconductor structures disposed between the source and the wafer stage. The electron distribution within the structures is electrically controlled to defame a desired microfabrication exposure pattern that modulates electromagnetic energy from said source that impinges on the wafer in accordance with a pattern. The modulated energy is used to expose the photoresist with the pattern. The wafer is then etched to selectively remove portions of the photoresist based on the desired microfabrication exposure pattern, and the etched wafer is treated to construct a semiconductor structure layer on the wafer.

In accordance with a further aspect provided by this invention, a diffraction limiter can be used to provide certain advantages associated with contact lithography without requiring some of the disadvantages of contact lithography. In accordance with this aspect of the invention, the diffraction limiter may provide an opaque layer in which there is an array of transparent regions ("holes") distributed in a one-to-one correspondence to the selective amplifiers/shutters. The diffraction limiter is placed in contact with the wafer, and the light that passes through the programmable layer is incident upon it. The diffraction limiter allows the advantages of contact lithography while maintaining the distance between the programmable layer and wafer.

In accordance with a farther aspect provided by the present invention, a programmable shutter array, a programmable selective amplifier array, and a diffraction limiter can all be used in a common system. For example, FIG. 7A depicts schematically a lithography setup incorporating the above three components. FIG. 7B shows a zoomed-in view of the diffraction limiter (denoted by "D") and wafer section. These three components provide a programmable lithography system that offers high throughput, extremely accurate pattern reproduction, and excellent resolution.

Implementing a diffraction limiter in conjunction with any programmable lithography system should significantly reduce the disadvantages associated with contact lithography. This device is placed in contact with the wafer and thus reduces the effects of diffraction (see FIGS. 7A and AB.) Even though the diffraction limiter is close to the wafer and could be damaged, it is inexpensive and is easily replaced. Additionally, one can apply techniques such as phase shifting and/or optical proximity correction on the diffraction limiter itself. Because of the simple, regular shape of the pixels on the diffraction limiter, such corrections should be easily optimized.

Lithography in accordance with the present invention potentially allows a high throughput to be achieved. For example, only a single programmable structure is necessary to print any desired pattern. A non-exhaustive list of some of the many features and advantages provided by the present invention are as follows:

Programmable lithography offers increased flexibility over conventional parallel lithography. This increased flexibility means that a greater variety of chips can be easily produced. It also opens up ways to improve the manufacture of all types of semiconductor products. It also simplifies the entire process of designing and manufacturing semiconductor products.

No need to have different masks to produce different chips. Because a single programmable structure can be programmed with an arbitrary pattern, it is no longer necessary to fabricate (and purchase) new mask sets in order to print new chips. This is extremely cost-effective for producing small quantities of specialized chips because the cost of a mask set can be prohibitively expensive. In producing large quantities of chips the cost of the mask set is less significant because it is a fixed cost amortized over many more chips.

Electronic alignment. Because it is extremely important to line up the current lithography step with previous steps, steppers spend a significant amount of time mechanically aligning the wafer with the mask. With programmable lithography the pattern can be programmed into the "programmable layer" (i.e. the programmable area within the mask) such that it is aligned with the wafer. This saves time over having to mechanically align as in the case of a conventional mask.

Disconnecting the size of the chip from the exposure size of the stepper. In conventional parallel lithography, the size of a chip is determined by the exposure size of the stepper. However, with programmable lithography a different pattern can be loaded into the programmable layer at each exposure. Hence, there is no longer any reason that the same pattern needs to be imaged each time the stepper does an exposure. Consequently, in programmable lithography, the size of the chip is not intrinsically determined by the size of each individual exposure. This "disconnect" between chip and exposure size is a significant advantage of programmable lithography because chip performance and chip size are closely tied together.

Simplified optical proximity correction. Optical proximity correction is a technique that is used to increase the resolution of the optical system at a given wavelength of light. Because of diffraction, the pattern on the mask is not faithfully reproduced on the wafer. In order to compensate for this, the pattern on the mask can be altered to account for diffraction so that the desired pattern can be imaged onto the wafer. One problem with this technique in a conventional mask is that it is difficult to decide how to alter the shape on the mask such that the desired shape will appear on the wafer. This is mainly due to the size and complexity of the desired pattern. Programmable lithography greatly simplifies this problem because in programmable lithography the same shape (e.g., a square) is always being imaged onto the wafer by each pixel, and the correction can be made on a pixel-by-pixel basis.

Simplified phase shifting. As with optical proximity correction, phase shifting is also a technique that is used to increase the resolution of the optical system at a given wavelength of light. In this technique, a material that causes a phase shift in light is placed on the mask. The phase shifting material causes destructive interference at the wafer between light from neighboring features in order to eliminate the diffraction tails. Phase shifting also suffers from the same problem as optical proximity correction; due to the size and complexity of the pattern it is difficult to decide where to place the phase shifting material. As with optical proximity correction, programmable lithography allows this problem to be greatly simplified because the same shape is always being imaged onto the wafer at each pixel. Programmable lithography also allows the possibility of active phase shifting. In active phase shifting, each pixel would contain an additional layer in which there would be a material whose index of refraction changes when a voltage is applied.

Simplification of the chip making process. One of the big problems facing chip manufacturers is the growing complexity of the chip making process. With each new chip the manufacturer must get a brand new mask set. They must also inspect and repair these masks. With programmable lithography only a single programmable structure is needed to produce an entire chip. In the event that a programmable mask breaks it can simply be replaced with another identical programmable mask. Additionally, programmable lithography will facilitate research and development of new products because of the greater ease of producing prototype devices.

The shutters and/or selective amplifiers can be fabricated easily. Each individual shutter can be a device similar to devices that are typically used in chips themselves. This allows the design and fabrication of the shutter to draw on the enormous amount of knowledge associated with production techniques and operation of these devices.

The shutters and/or selective amplifiers can be small and densely packed. Small shutters mean that the lithography system can produce small features without the need for demagnification, although it could be used in a system that does include demagnification. Densely packed shutters mean high throughput because they reduce the number of exposures necessary to expose the entire wafer.

The shutters and/or selective amplifiers can work for short wavelength light. Shorter wavelengths provide better resolution, which is important for chip performance.

The shutters and/or selective amplifiers Generally will not break during normal operation. This is important because the mask must be able to flawlessly reproduce the desired image. If even a single pixel is incorrect then the entire chip is likely to be worthless.

The shutters and/or selective amplifiers can switch states quickly. The speed of the shutters is relevant for throughput and may become significant when many shutters must be addressed.

Selective amplifiers can be used alone and/or in combination with programmable shutters. An array of selective amplifiers can be used in the place of or in addition to a PPM to project more light onto the wafer in some areas than in others corresponding to the pattern to be imaged. Or, an array of selective amplifiers can be used in a stand-alone system, e.g., when the non-amplified light is not sufficient to expose the resist and the amplified light is.

Programmable lithography provides a resolution and throughput comparable to conventional parallel lithography while retaining all of the advantages of programmable lithography.

BRIEF DESCRIPTION OF THE DRAWINGS

These and other features and advantages provided by the present invention will be better and more completely understood by referring to the following detailed description of presently preferred example embodiments in conjunction with the drawings, of which:

FIGS. 13B to 13G shows an example electronic alignment technique in accordance with the present invention.

DETAILED DESCRIPTION OF THE EXAMPLE EMBODIMENTS

Figure 8:
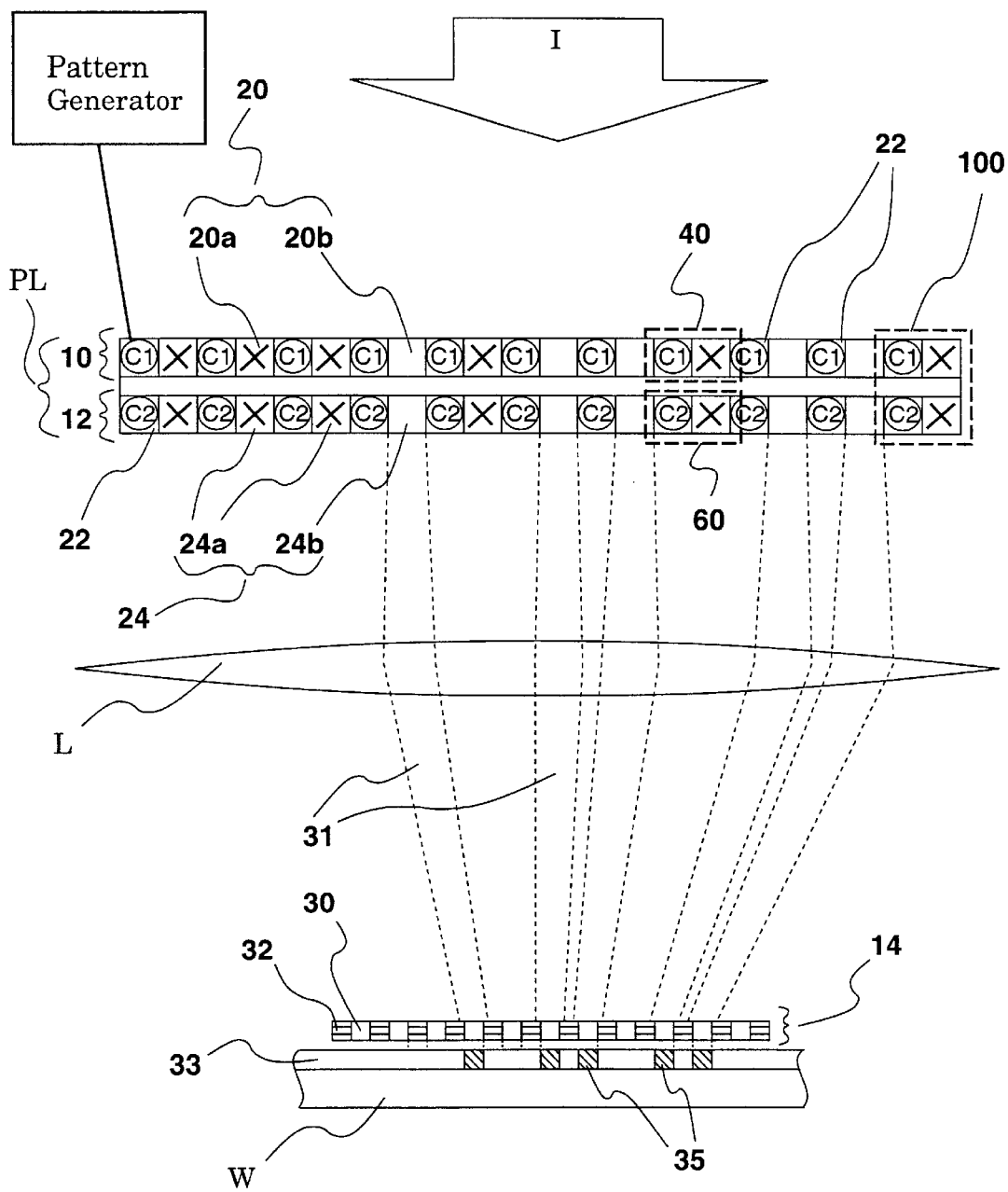
FIG. 8 shows a more detailed example embodiment of the invention and its components in accordance with the present invention.

In an example preferred embodiment, the invention consists of three main components: an array of selective amplifiers 10, an array of solid-state shutters 12, and a diffraction limiter 14. Taken together, the array of amplifiers 10 and the array of shutters 12 form what we shall call a "programmable layer", PL. FIG. 8 shows these three components incorporated into an example setup for performing lithography. In this figure, incident light, I, shines on the programmable layer from above. A pattern generator feeds the user-defined pattern into the programmable layer.

The array of selective amplifiers 10 consists of regions of a permanently opaque material 22 (a metal such as aluminum) and active regions 20. Each active region 20 within the array of selective amplifiers 10 is associated with a single selective amplifier 40. The active regions 20 can be toggled between a non-amplifying 20a and amplifying 20b state via control circuitry (designated by an encircled C1).

Following the array of selective amplifiers 10 is an array of solid-state shutters 12. The array of solid-state shutters 12 consists of regions of a permanently opaque material 22 and active regions 24. Each active region 24 within the array of shutters 12 is associated with a single shutter 60. The active regions 24 can be toggled between an opaque 24a and a transparent 24b state via control circuitry (designated by an encircled C2).

For reference, a given selective amplifier 40 and its corresponding solid-state shutter 60 will be taken as a "programmable pixel" 100.

A diffraction limiter 14 is placed in contact with a resist-coated wafer. The diffraction limiter 14 is comprised of regions of a transparent material 30 (such as single crystal sapphire) and regions of an opaque material 32 (a metal such as aluminum). In the preferred embodiment, this is accomplished by depositing opaque material such as aluminum onto a transparent substrate such as sapphire. The transparent regions individually correspond to the locations of the active regions of the programmable pixels in the programmable layer.

Figure 9:
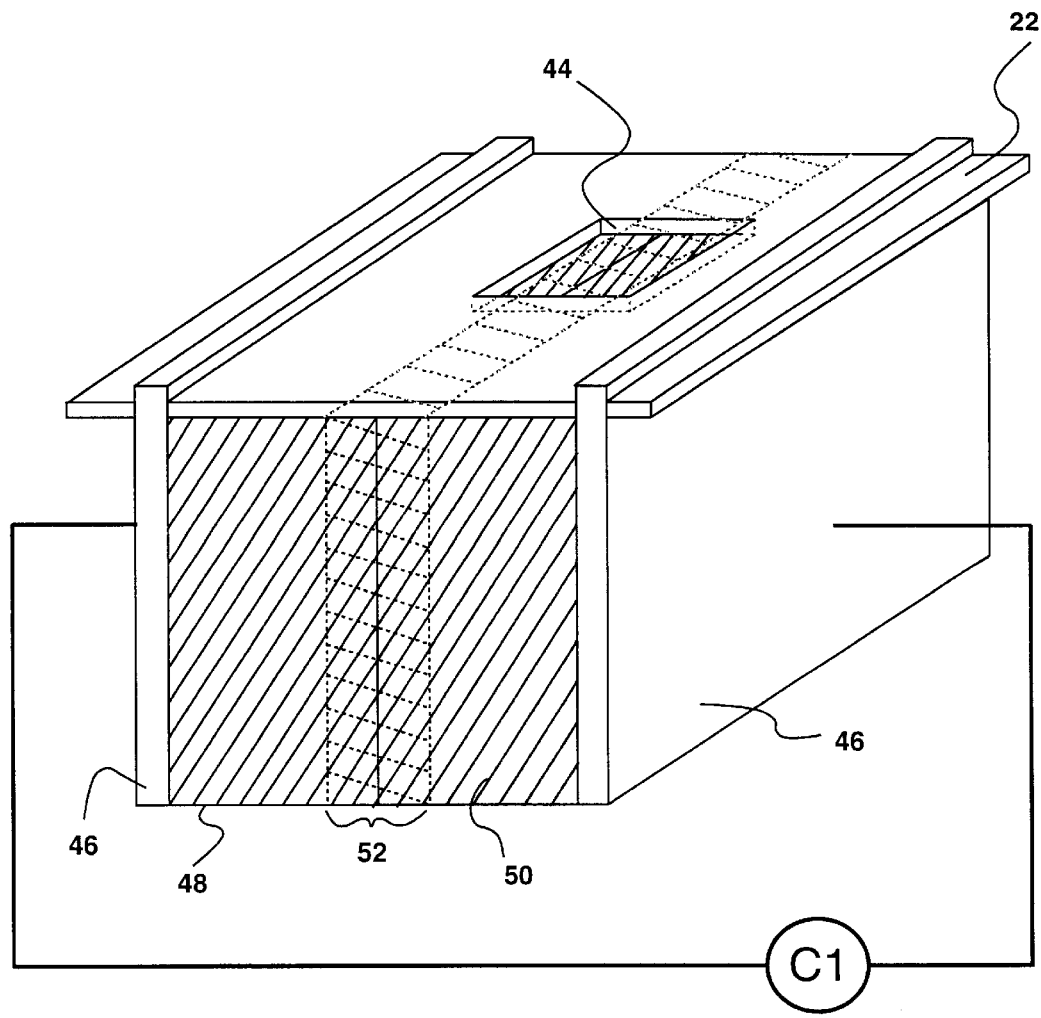
FIG. 9 shows an example single selective amplifier and its components in accordance with the present invention.

FIG. 9 details a single selective amplifier 40. Each single selective amplifier 40 consists of a section (46, 48, 50, 52) capable of selectively amplifying a beam of light, the circuitry C1 needed to control the state of the selective amplifier, and a material 22 that blocks the light between adjacent selective amplifiers. In the preferred embodiment, the section capable of selectively amplifying light is a junction 52 between a p-type semiconductor 48 (such as p-doped GaN) and an n-type semiconductor 50 (such as n-doped GaN) with metal contacts 46 (such as aluminum) that are used to bias the junction 52. The control circuitry C1 would be capable of turning the bias on or off. The plane of the p-n junction 52 is oriented such that the normal of the plane is perpendicular to the incoming light. The p-n junction 52 is exposed to the incident light through a hole 44 in the permanently opaque region 22. The semiconductor materials 48 and 50 must be chosen such that stimulated emission occurs for the wavelength of incident light being 10o used.

Figure 10:
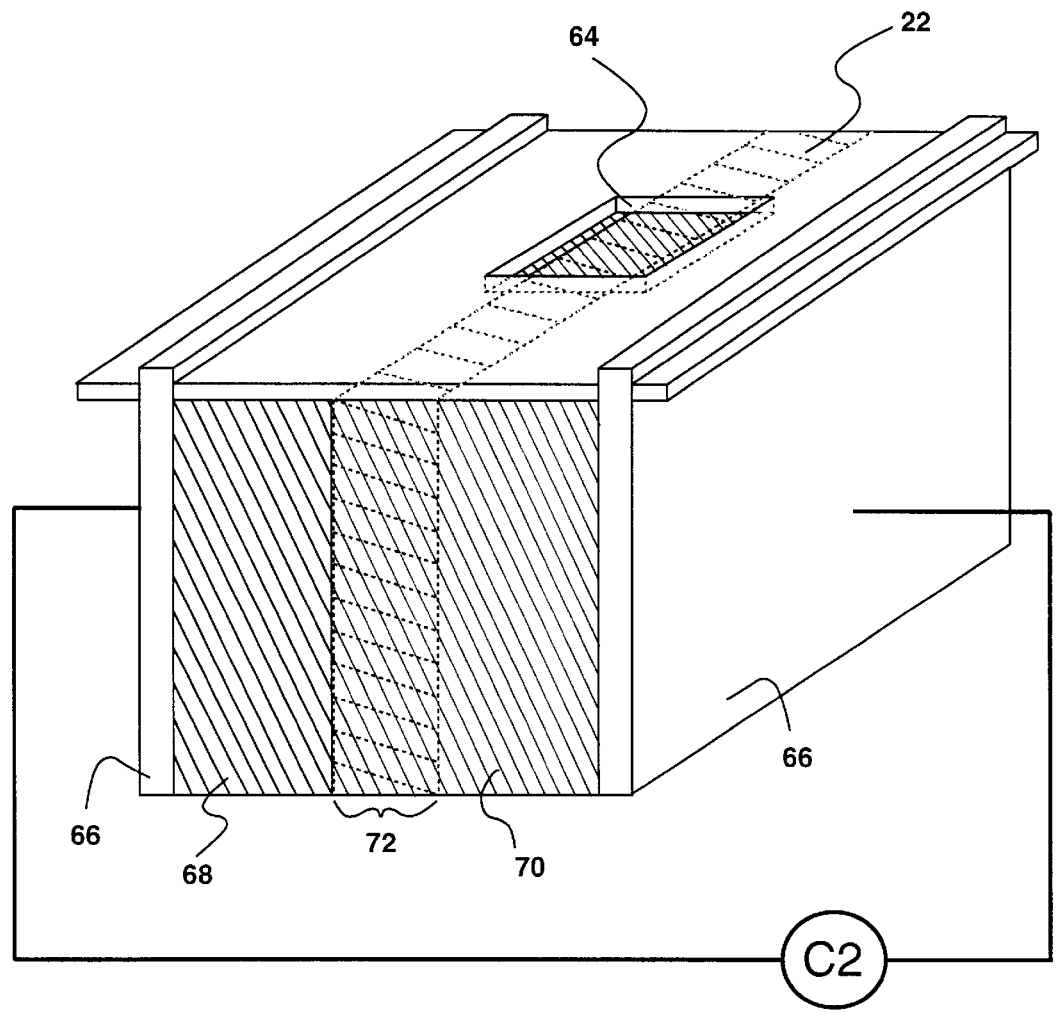
FIG. 10 shows an example single shutter and its components in accordance with the present invention.

FIG. 10 details a single solid-state shutter 60. Each single solid-state shutter 60 consists of a section (66, 68, 70, 72) capable of either blocking or transmitting the incident light, the circuitry C2 needed to control the state of the shutter, and a material 22 that blocks the light between adjacent shutters. In the preferred embodiment, the section capable of either blocking or transmitting light is a MOS structure: an insulator region 68 (such as $SiO_2$) is sandwiched between metal electrodes 66 (such as aluminum) and a semiconductor region 70 (such as n-doped ($n^{++}$) GaN). Control circuitry C2 is used to bias the MOS structure across the electrodes 66. The active region 72 is exposed to the incident light through a hole 64 in the permanently opaque region 22.

Figure 11:
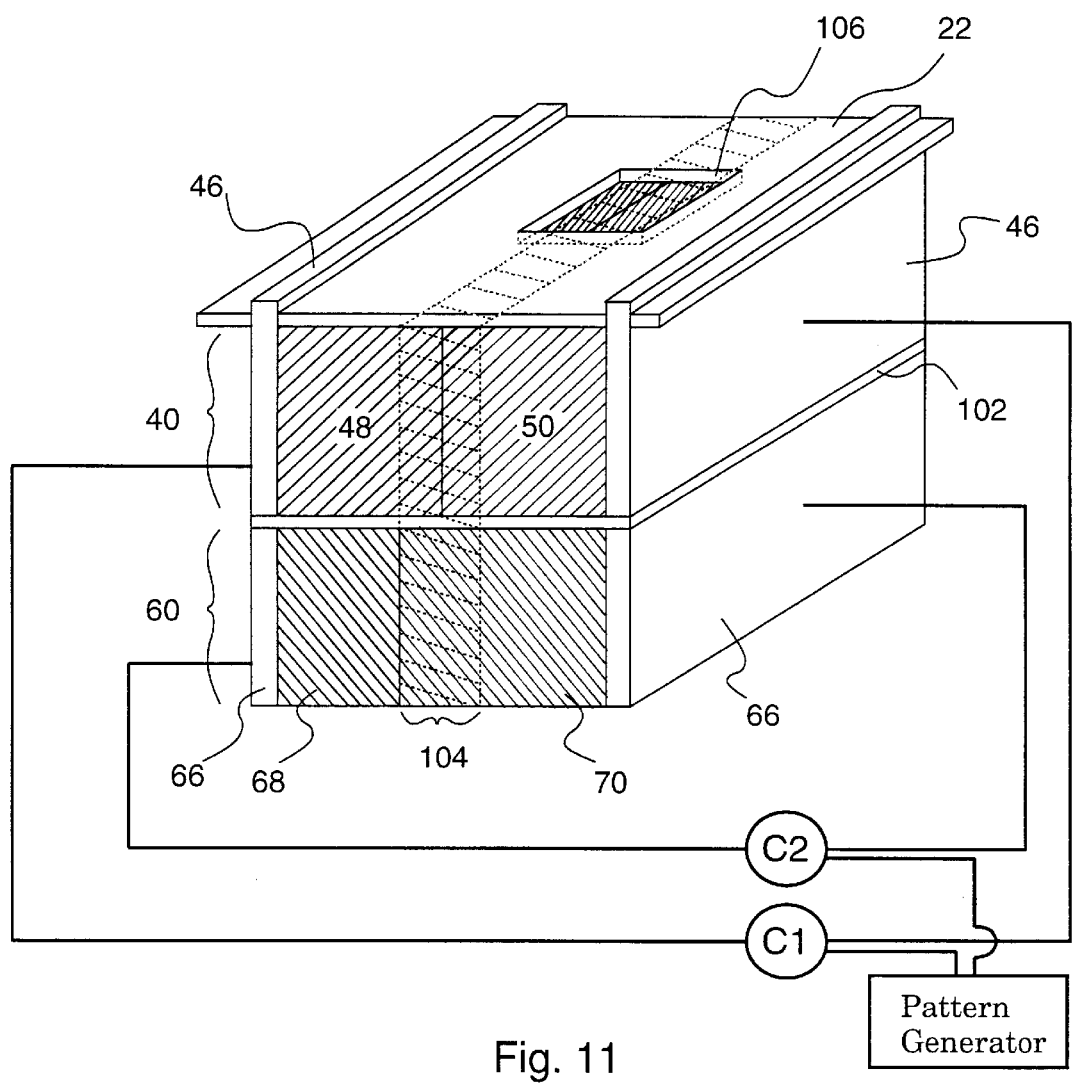
FIG. 11 shows an example single programmable pixel and its components in accordance with the present invention.
Figure 12B:
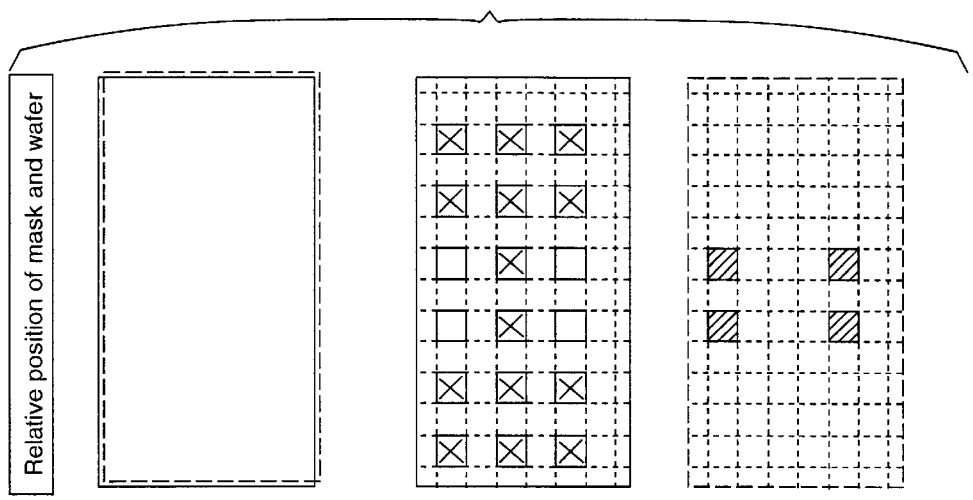
FIGS. 12A to 12H show an example technique of programmable lithography for a "4-step programmable layer" in accordance with the present invention.
Figure 12A:
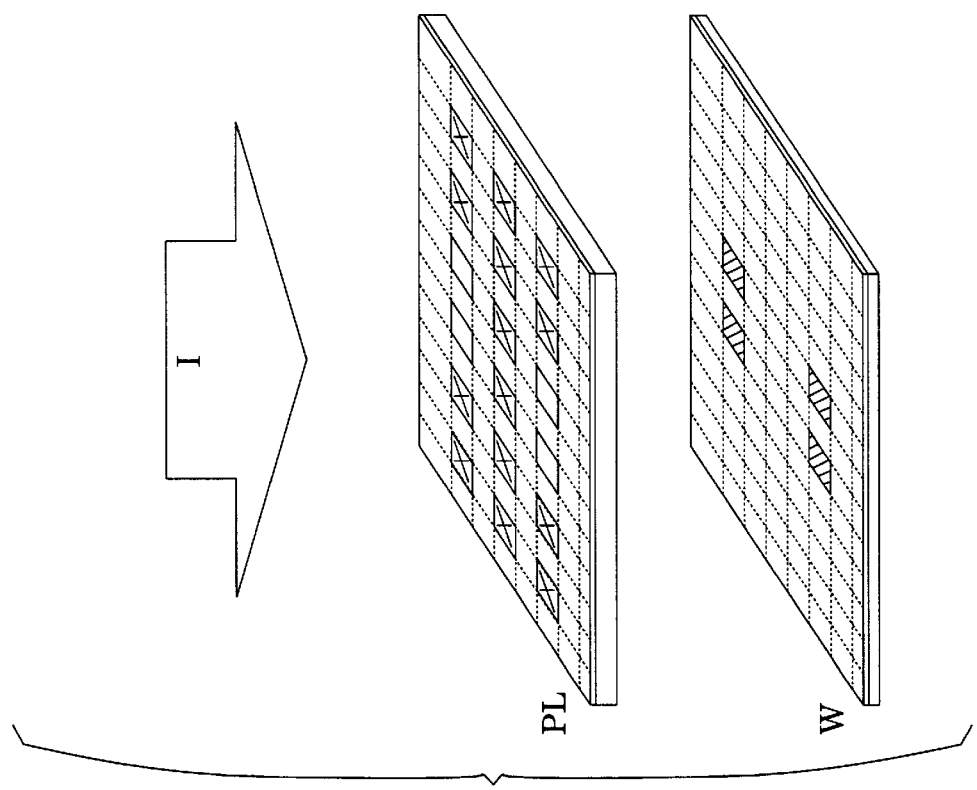
Figure 12D:
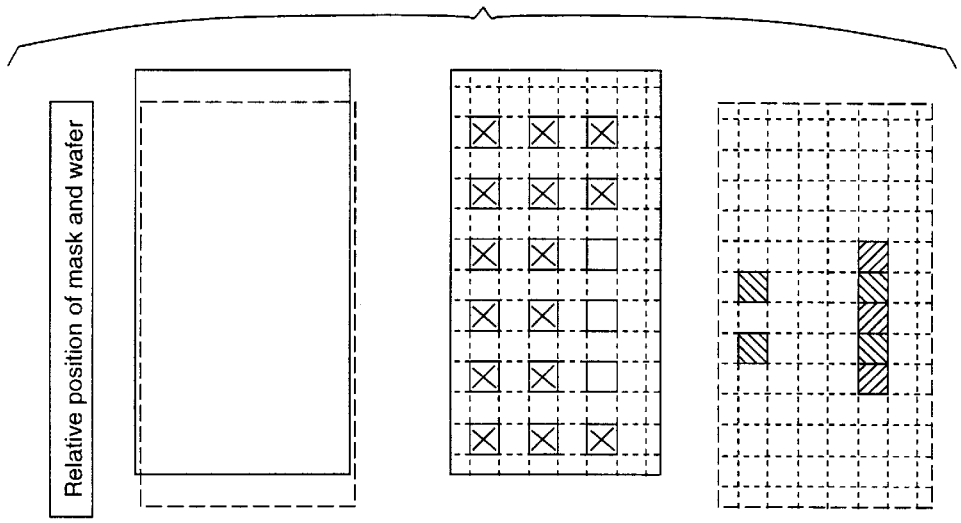
Figure 12C:
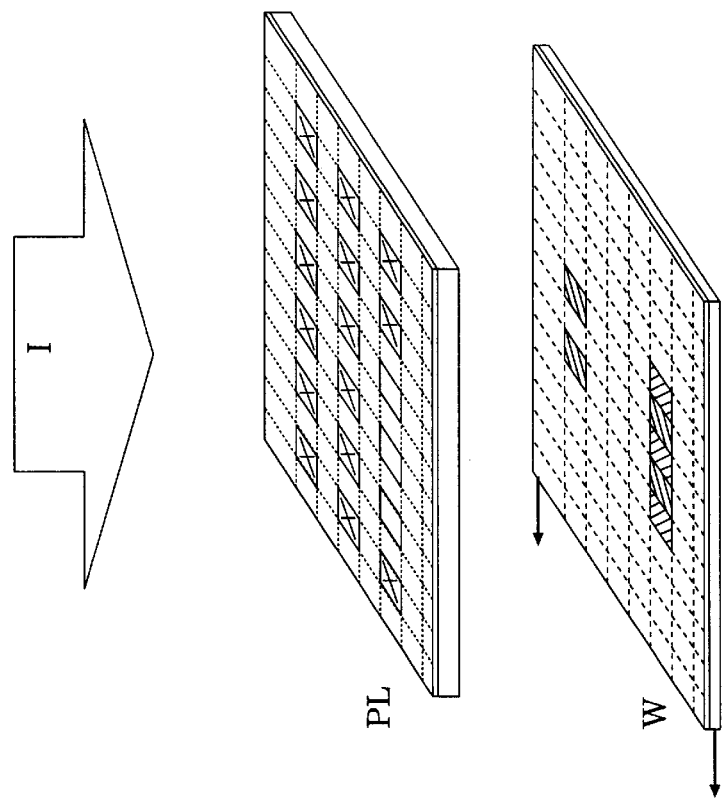
Figure 12F:
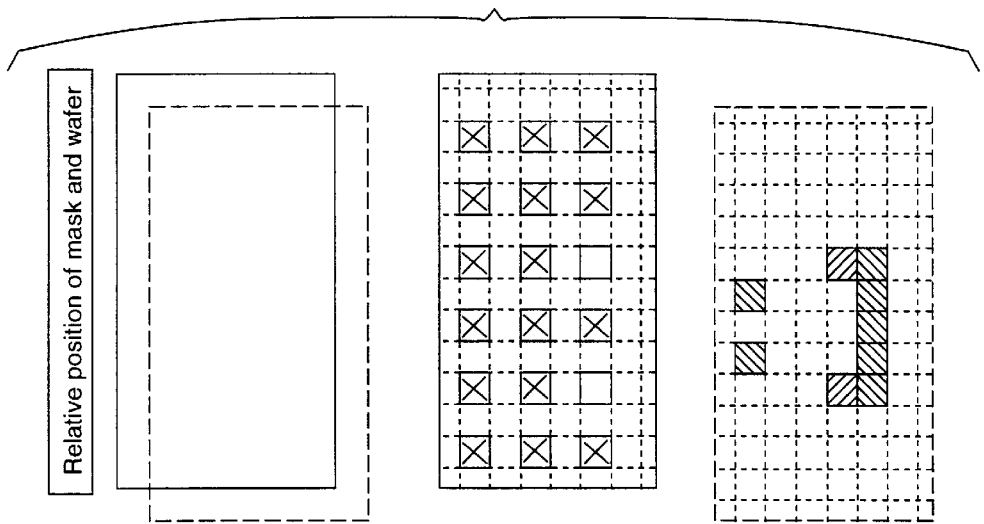
Figure 12E:
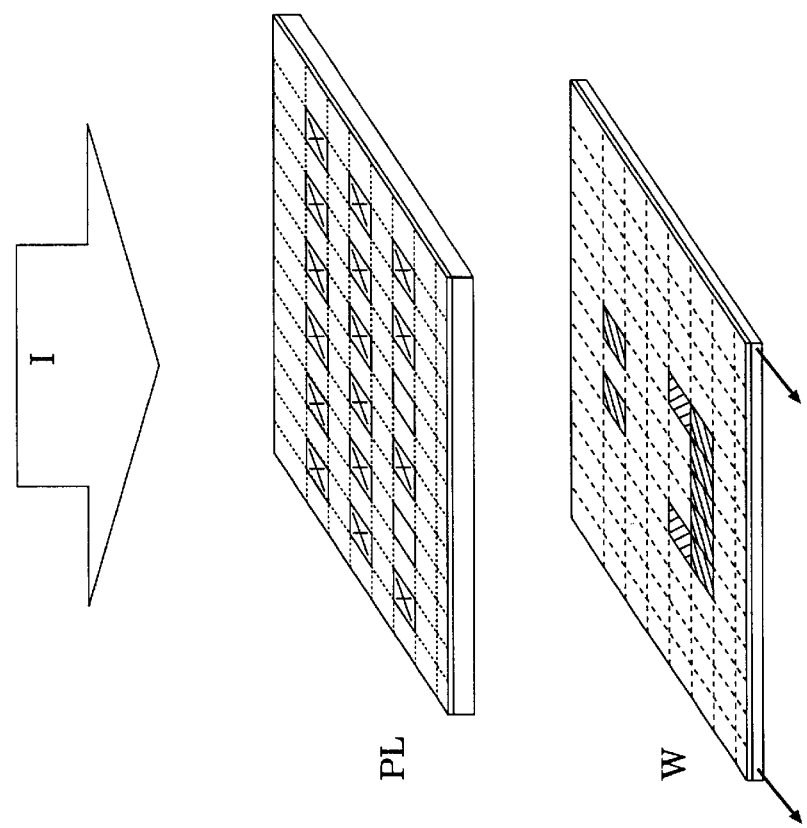
Figure 12H:
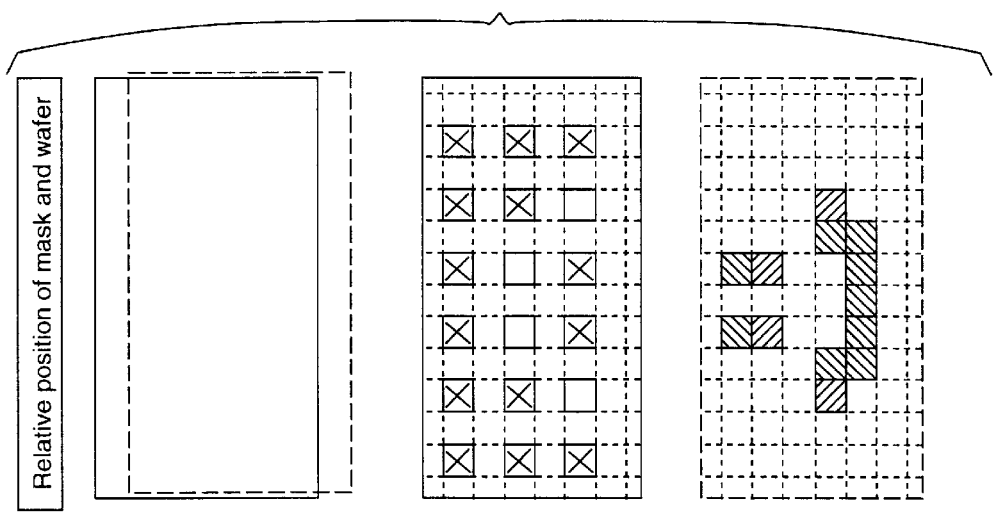
Figure 12G:
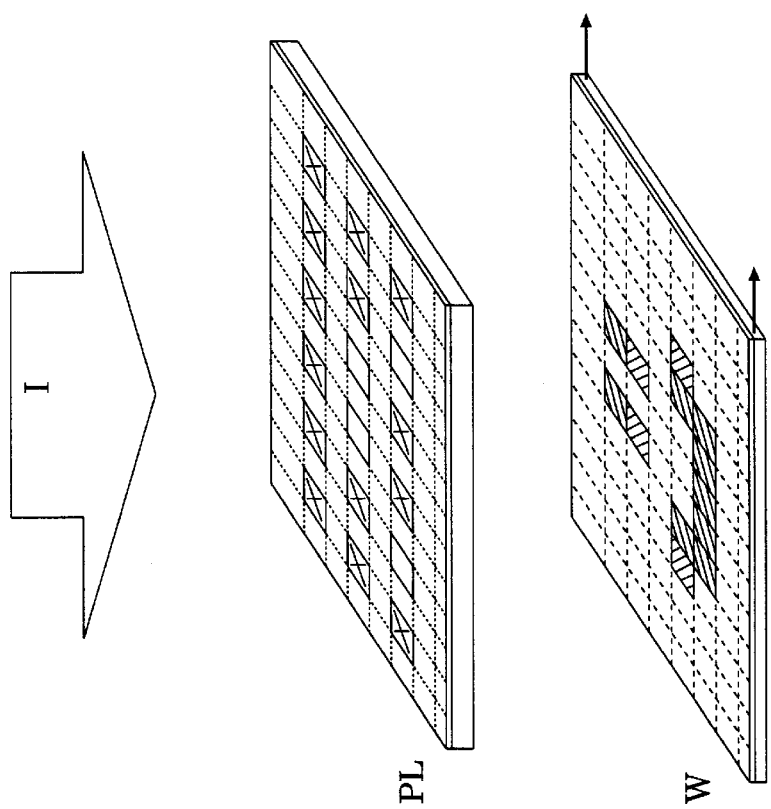

FIG. 11 details a programmable pixel 100. Each programmable pixel 100 consists of a single selective amplifier 40, a single shutter 60, a transparent insulator 102 (such as $SiO_2$) between the amplifier and shutter, the control circuitry, represented by an encircled C1 and C2, needed to control the state of the pixel, and a material 22 that blocks the light between adjacent pixels. The active region of the amplifier portion 52 must overlap the active region of the shutter 72 to form the active region of the pixel 104. The active region of the pixel 104 is exposed to the incident light through a hole 106 in the permanently opaque region 22.

The combined control circuitry, C1 and C2, needs to be capable of toggling a voltage across each individual pixel 100 depending on the pattern supplied by the user via the pattern generator. This control circuitry is similar to the standard type of addressing used in memory devices or an LCD.

The above-described example embodiment is specified as to be useful in a lithography system utilizing (approximately) 385 nm (and longer) wavelength light. However, there are many other possible embodiments. For instance, the choice of specific materials for the various semiconductors and insulators can render the system useful for other wavelengths of incident light. Specifically, the band gap of the semiconductor in the selective amplifier determines the wavelengths of light that can be amplified. Of course, the materials chosen for the amplifier must be capable of amplifying light. For example, this could be accomplished in the manner described in the ensuing theory of operation section. Likewise, for the shutter, the materials used can be optimized for operation with a selected wavelength of incident light, again described in the theory of operation section.

Also, the specific geometry of electrodes and active materials could be modified while still retaining the usefulness of the invention. For instance, all the electrodes could be placed on the top surface of the device. Or, for example, the orientation of the plane of the junctions does not necessarily need to be completely perpendicular to the incoming light. This could simplify the fabrication process of the pixels.

Furthermore, since shorter wavelengths are desirable in lithography, materials with a large band gap are desirable for use in the pixels. In fact, some materials that may not typically be thought of as semiconductors may be useful for our purposes because they have a large band gap, such as sapphire, diamond, $SiO_2$, LiF, ZnS, AlN, ZnSe, At etc. . . . Additionally, in the amplifier section, our invention uses electric fields to induce a population inversion, but this is not the only possible means of doing so. Other techniques include but are not limited to optical pumping, thermal pumping, etc. . . . Similarly, in the shutter section, our invention uses electric fields to change the density of occupied states, but this is not the only possible means for doing so. Other techniques include but are not limited to changing the temperature of the semiconductor or shining light onto the semiconductor.

There is a large field of research devoted to controlling population densities for the purpose of creating, manipulating, blocking, or amplifying light. One active area of interest in this field is the creation of semiconductor lasers. Many of the structures created for semiconductor lasers or optical amplifiers could be used for selective amplification (in fact, semiconductor lasers could be used in the place of the selective amplifiers, in which case an external light source would not be necessary.) These other structures would include but would not be limited to heterostructures and vertical cavity surface emitting lasers (VCSELs). Similar structures could also be used for the shutter. While these other structures operate on similar principles to those described in the theory of operation section, they might provide some advantages, like decreasing the amount of voltage or current required to operate the device, or increasing the area of the active region.

There are also many possible alternate embodiments for the diffraction limiter. The materials must merely satisfy the requirement that the transparent regions individually correspond to the locations of the active regions of the programmable pixels in the programmable layer with opaque regions in between. For instance, the transparent regions could be physical holes etched through an opaque substrate, or, the transparent and opaque regions could be semiconductors with varying levels and/or kinds of doping.

Example Operation of Preferred Embodiments

In accordance with the preferred embodiments described above, each individual pixel 100 has the ability to either block or amplify light, I, and is able to be toggled between the two settings by means of the control circuitry C1 and C2. The pattern generator will control the individual pixels 100 in such a way that the control circuitry C1 and C2 always act in tandem within a given pixel.

The pattern generator addresses the control circuitry C1 to control a potential difference across the metal contacts 46. If the semiconductor 48 is doped n-type and the semiconductor 50 is doped p-type, then a depletion region is created in the active region 52. When a potential difference is applied across the contacts 46, a population inversion is formed in the depletion (active) region 52. Incident light of the appropriate wavelength causes stimulated emission and is thus amplified in the active region 52. If no potential difference is applied across the contacts 46, the light passes through the region 52 unaltered.

This satisfies our requirement for a selective amplifier.

The pattern generator simultaneously addresses the control circuitry C2 to control a potential difference across the metal contacts 66. When a potential difference is applied, this changes both the density of states and the conductivity of the semiconductor 70 in the region 72 adjacent to the semiconductor-insulator (70–68) interface.

For instance, if the semiconductor 70 is doped n-type and a proper potential difference is applied across the metal contacts 66, then a depletion region is created in the active region 72. In the depletion (active) region 72 the conduction band electrons are repelled by the electric field created by the bias. The conductivity is dramatically decreased in the depletion (active) region 72. The density of occupied states in the depletion (active) region 72 is also changed because the states at the bottom of the conduction band that were previously filled are no longer filled. Hence, incident light with energy less than the semiconductor 70 band gap is transmitted through the device in the presence of a potential difference, and is absorbed in the absence of a potential difference. (Conversely, as per the theory of operation section, certain wavelengths of light with an energy greater (including x-rays) than the semiconductor 70 band gap are transmitted through the device in the absence of a potential difference, and are absorbed in the presence of a potential difference.) This satisfies our requirement for a shutter.

Figure 1:
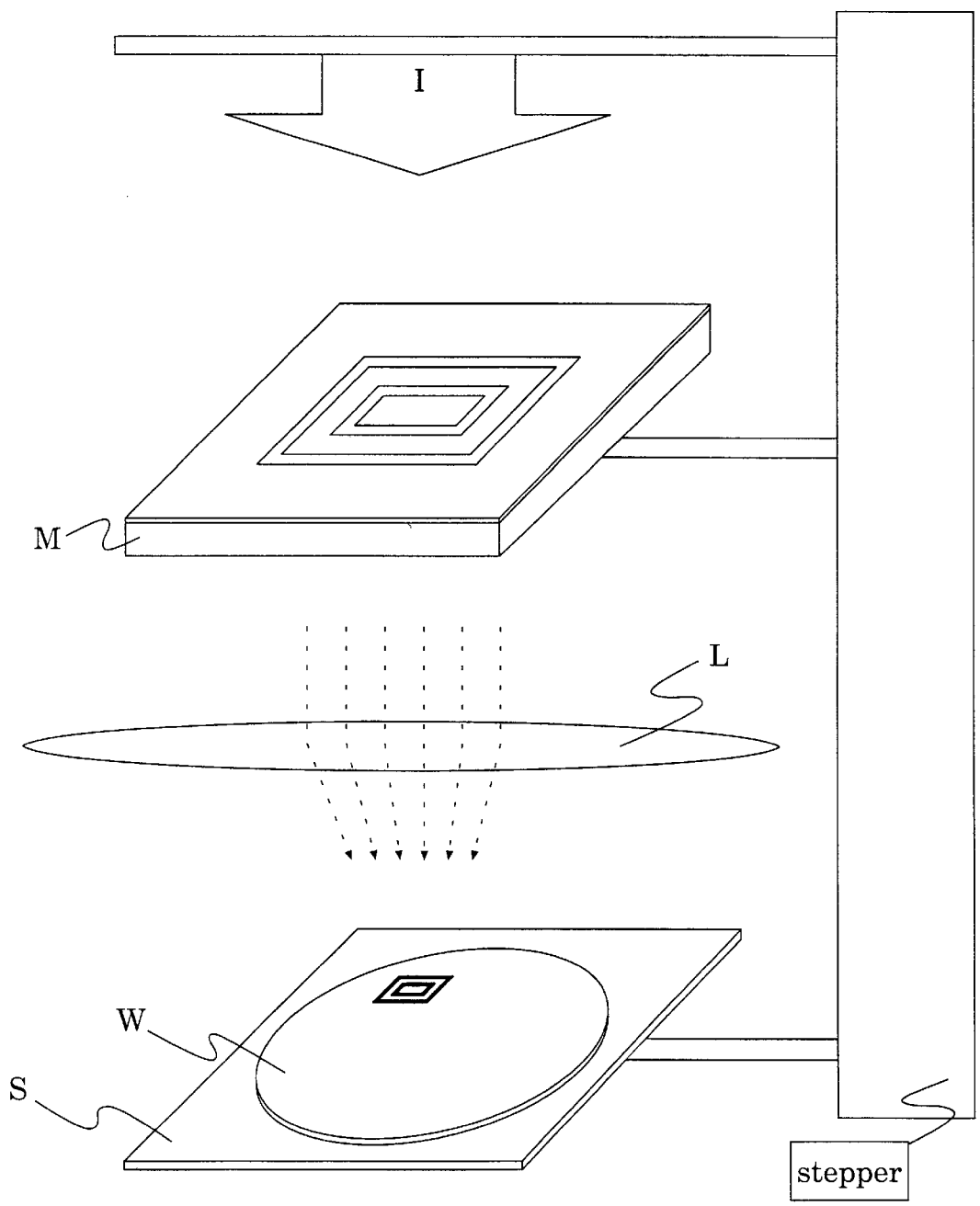
FIG. 1 shows an example prior art technique of parallel lithography using a stepper.
Figure 2A:
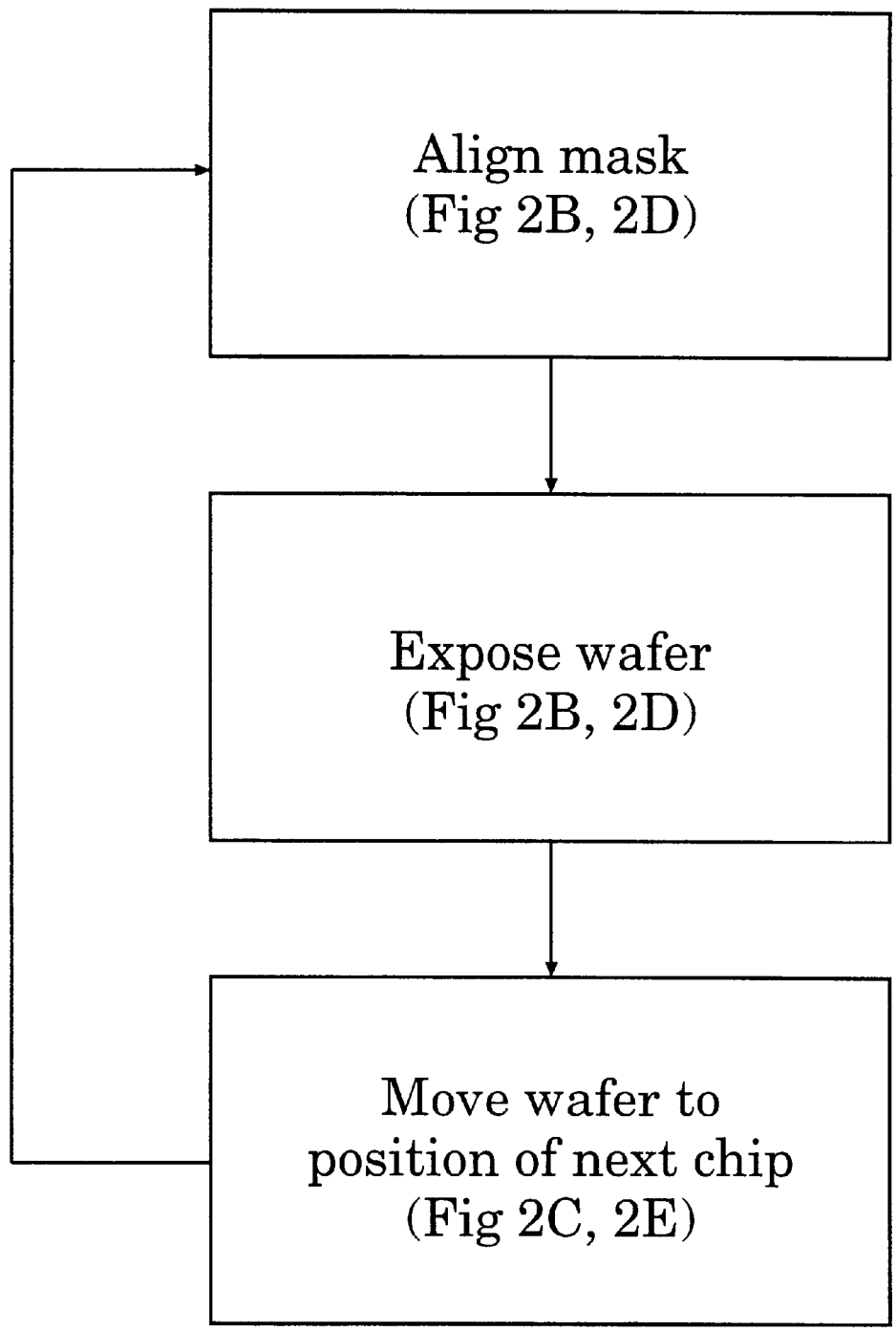
FIG. 2A summarizes the operation of an example prior art stepper.
Figure 2B:
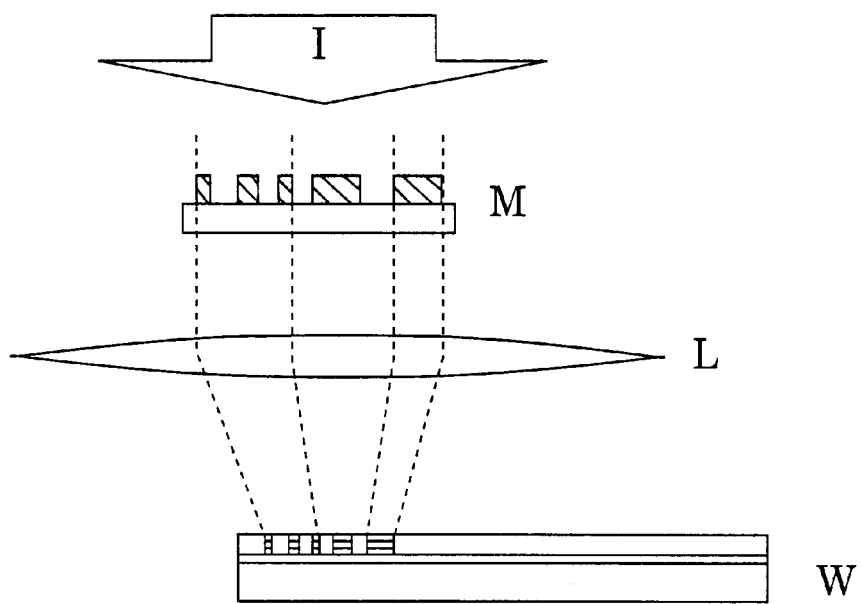
FIGS. 2B to 2E show the simplified operation of an example prior art stepper.
Figure 2C:
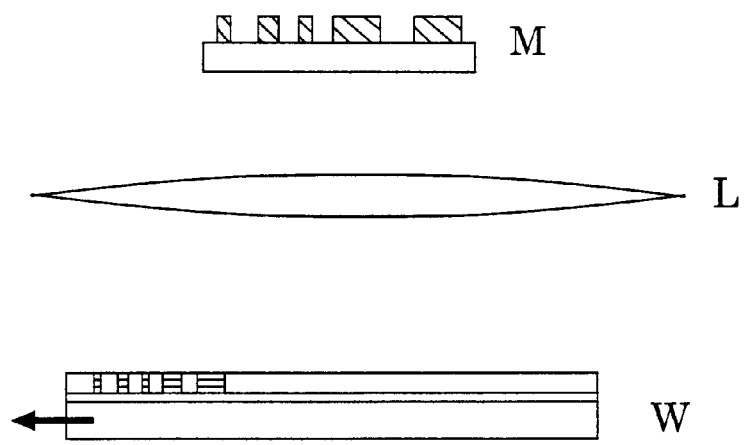
Figure 2D:
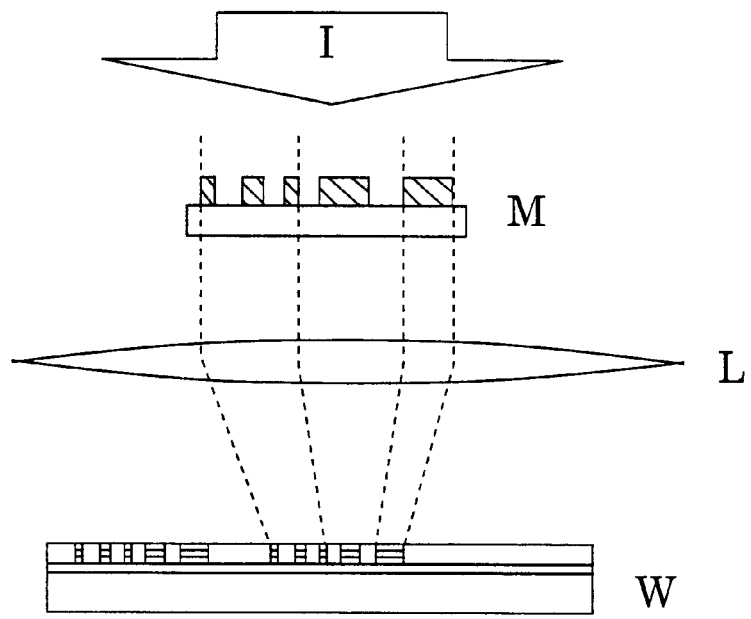
Figure 2E:
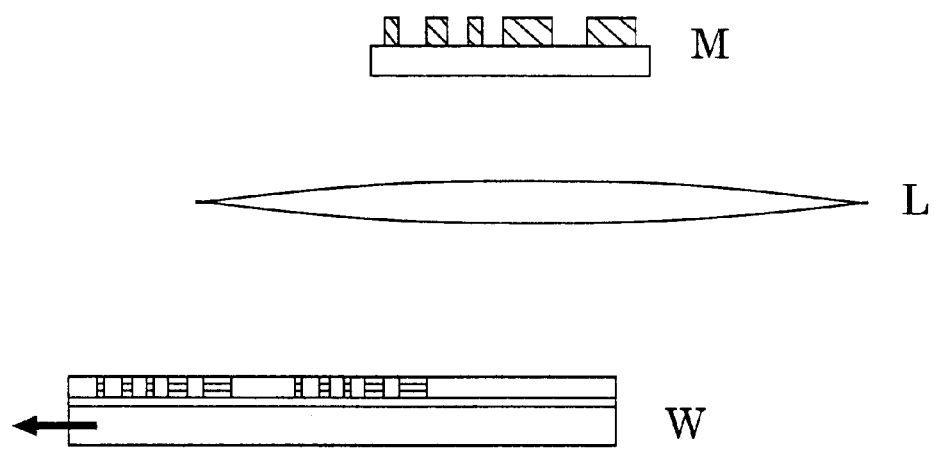
Figure 3A:
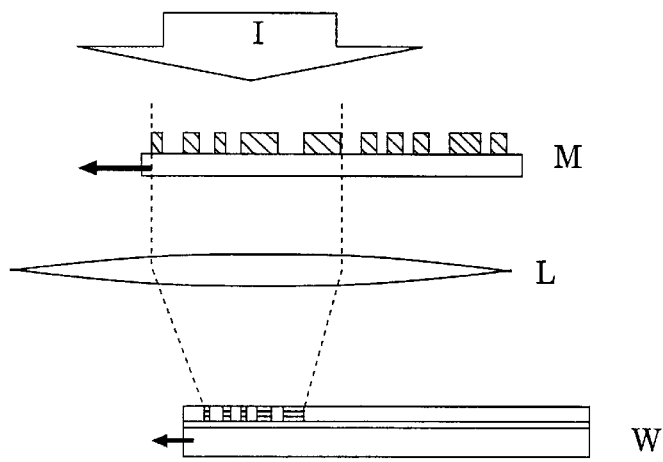
FIGS. 3A to 3C show the simplified operation of an example prior art scanner.
Figure 3B:
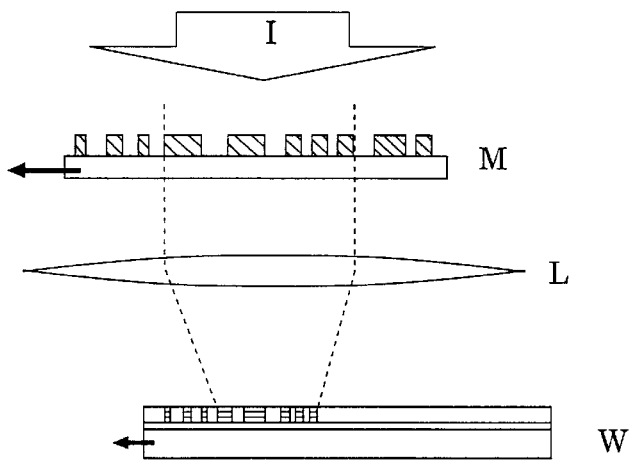
Figure 3C:
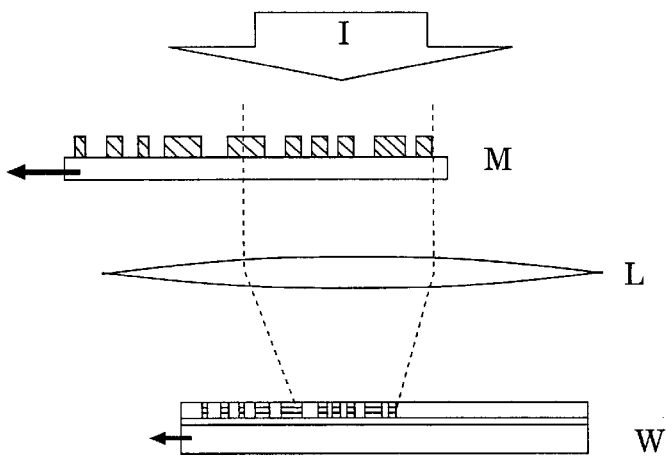
Figure 4:
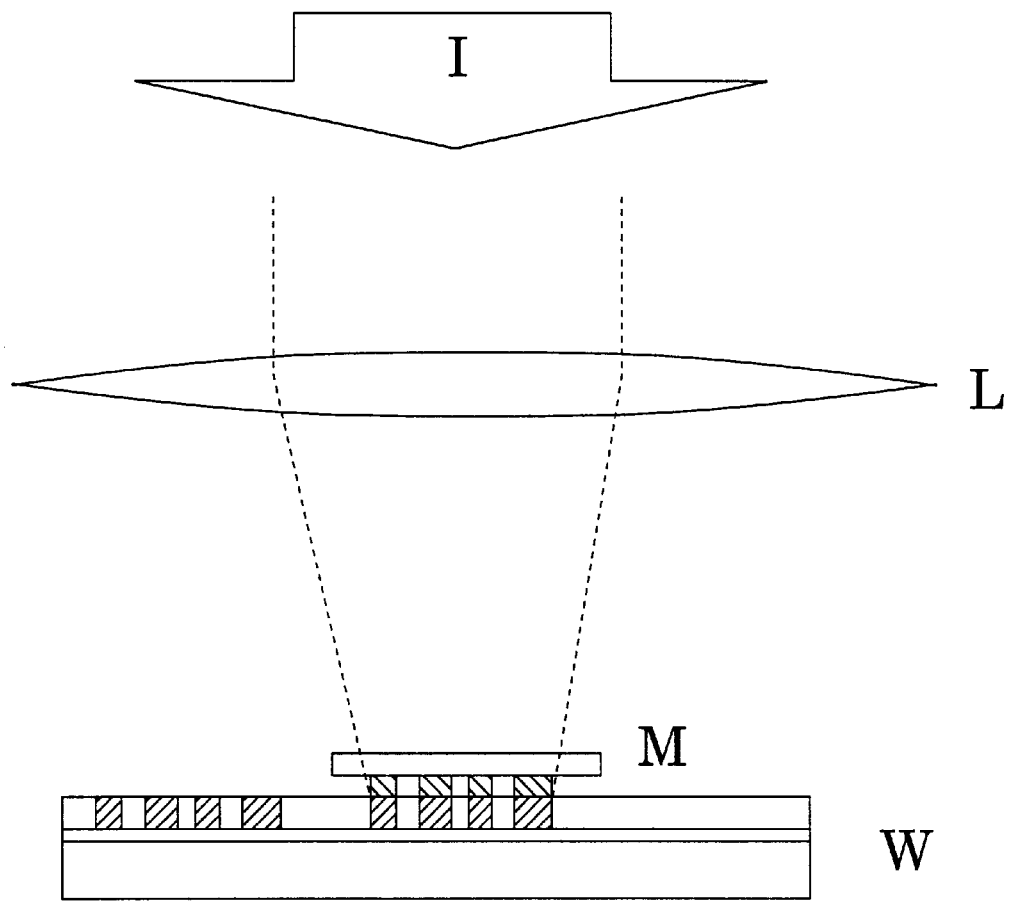
FIG. 4 shows an example prior art contact lithography technique.
Figure 5A:
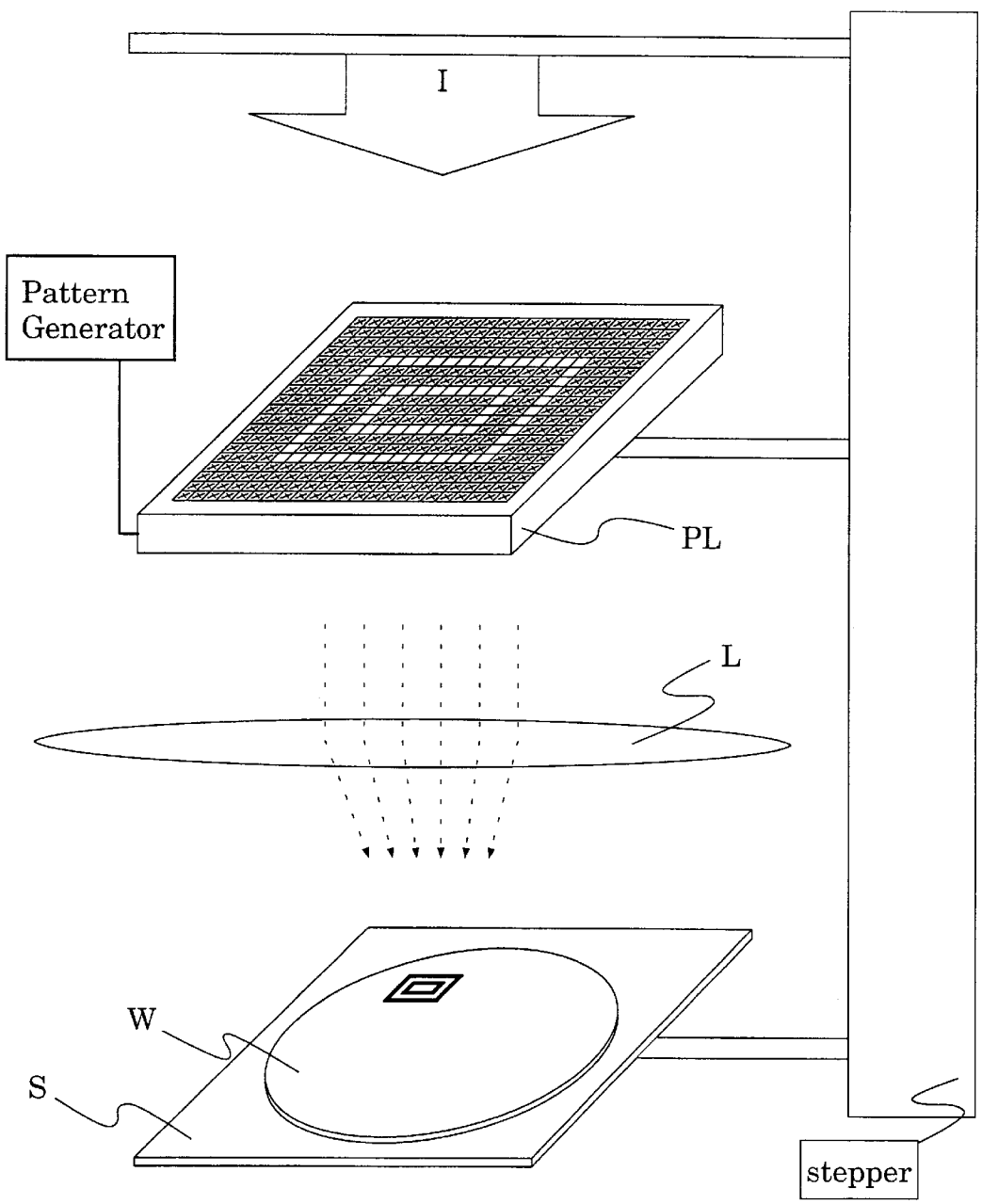
FIGS. 5A and 5B show a simplified example of technique of lithography in accordance with a preferred embodiment of the present invention using a programmable structure.
Figure 5B:
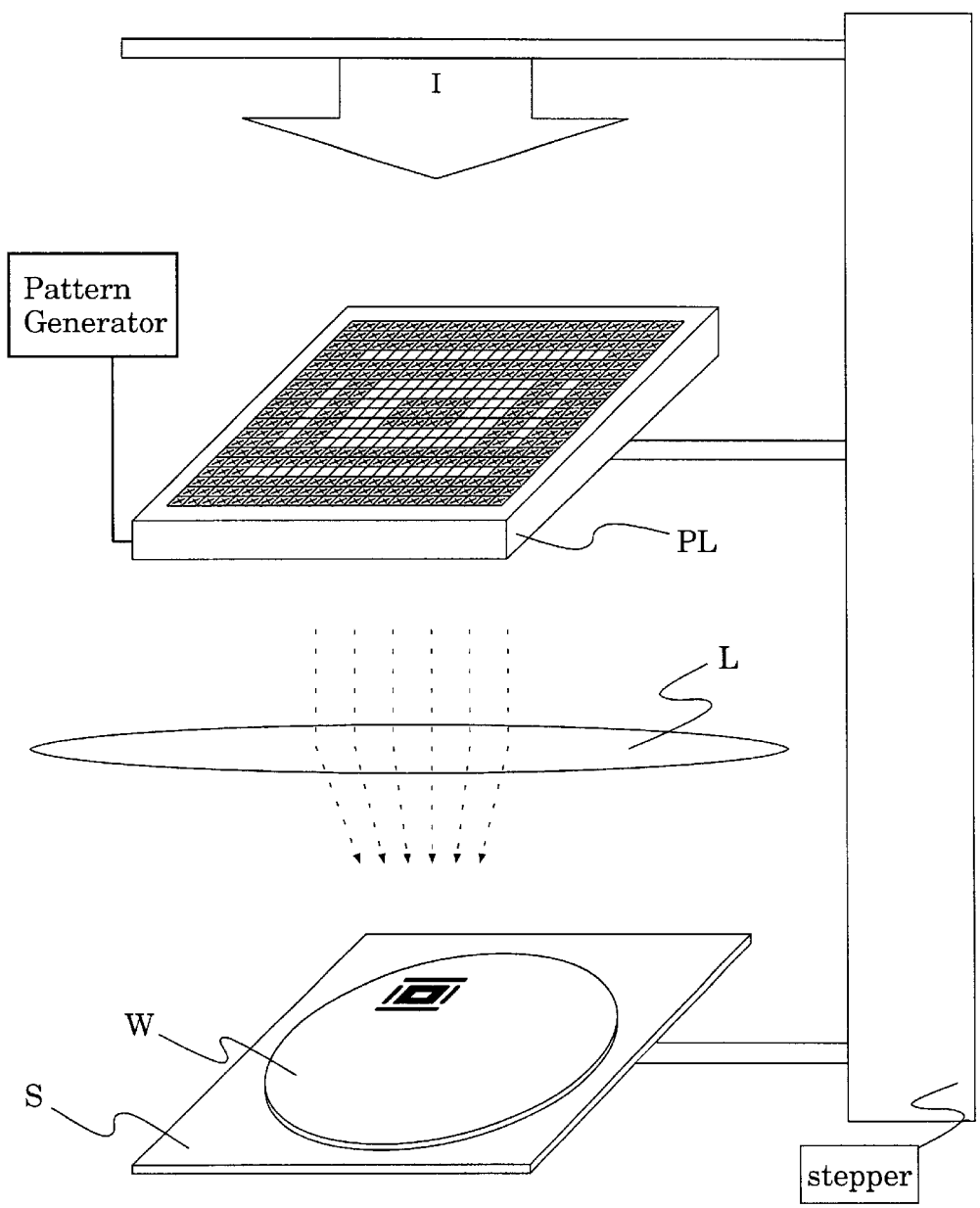
Figure 6A:
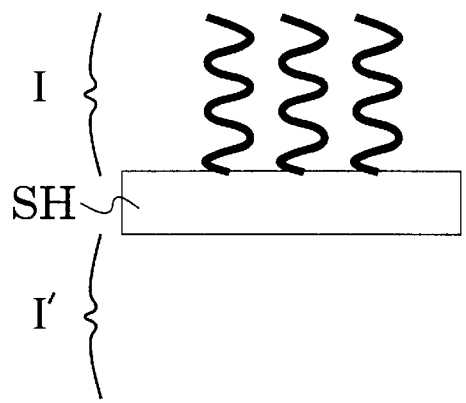
FIGS. 6A and 6B illustrate example operation of shutters provided in accordance with the present invention.
Figure 6B:
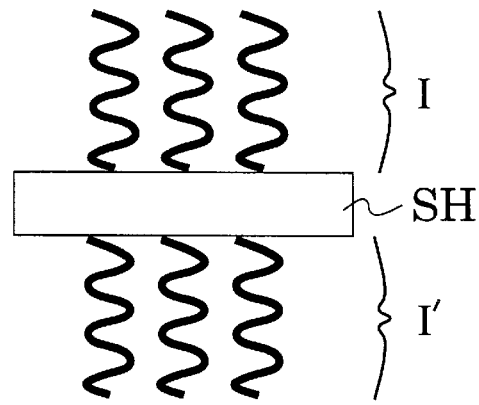
Figure 6C:
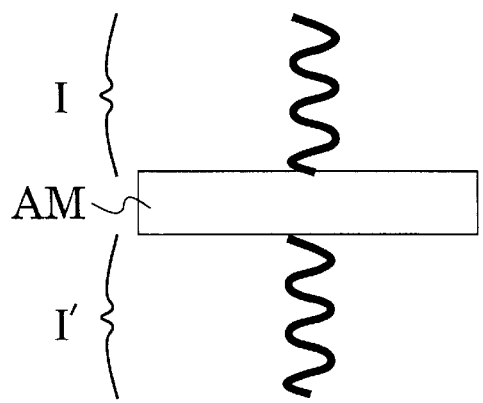
FIGS. 6C and 6D illustrate example operation of selective amplifiers provided in accordance with the present invention.
Figure 6D:
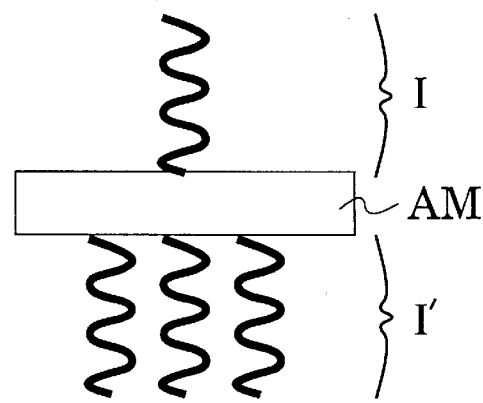
Figure 6E:
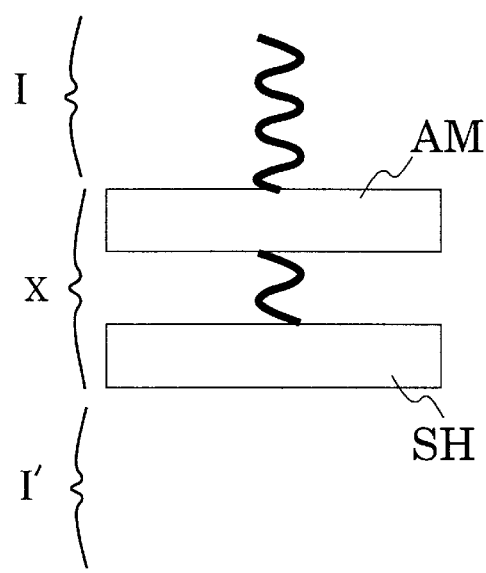
FIGS. 6E and 6F illustrate example operation of a combination shutter/selective amplifier array in accordance with the present invention.
Figure 6F:
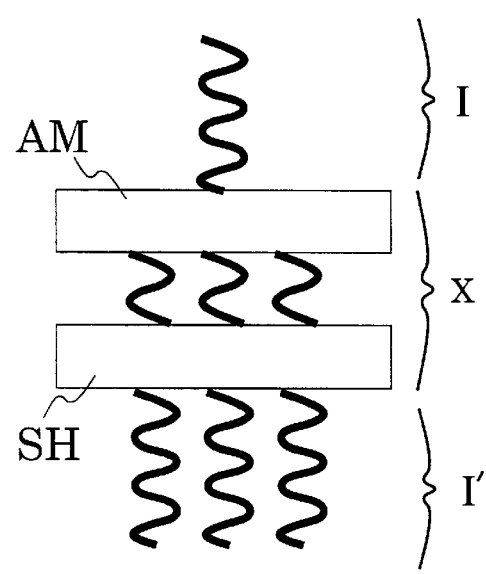
Figure 7A:
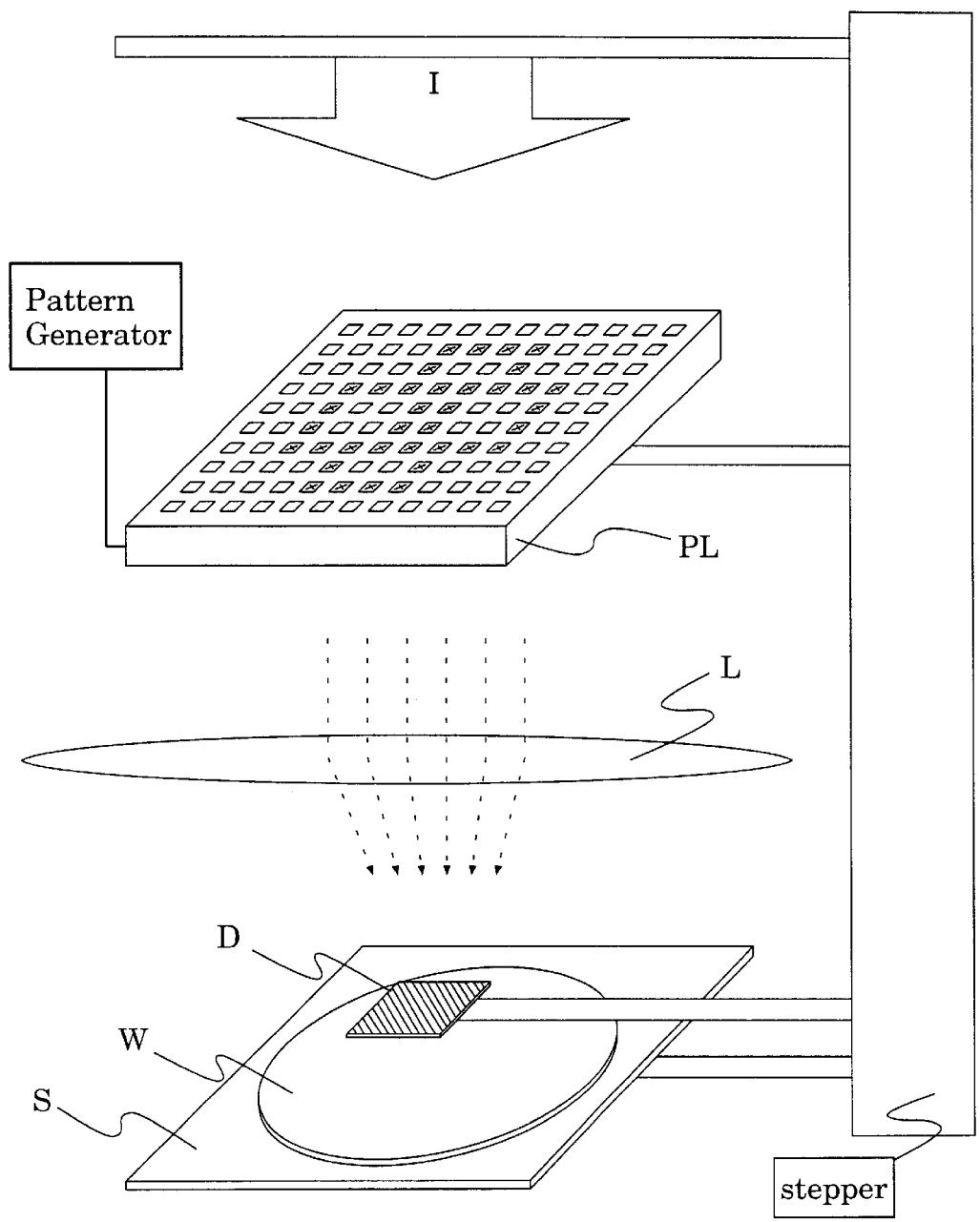
FIG. 7A shows an example lithography setup in accordance with a presently preferred example embodiment of the present invention.
Figure 7B:
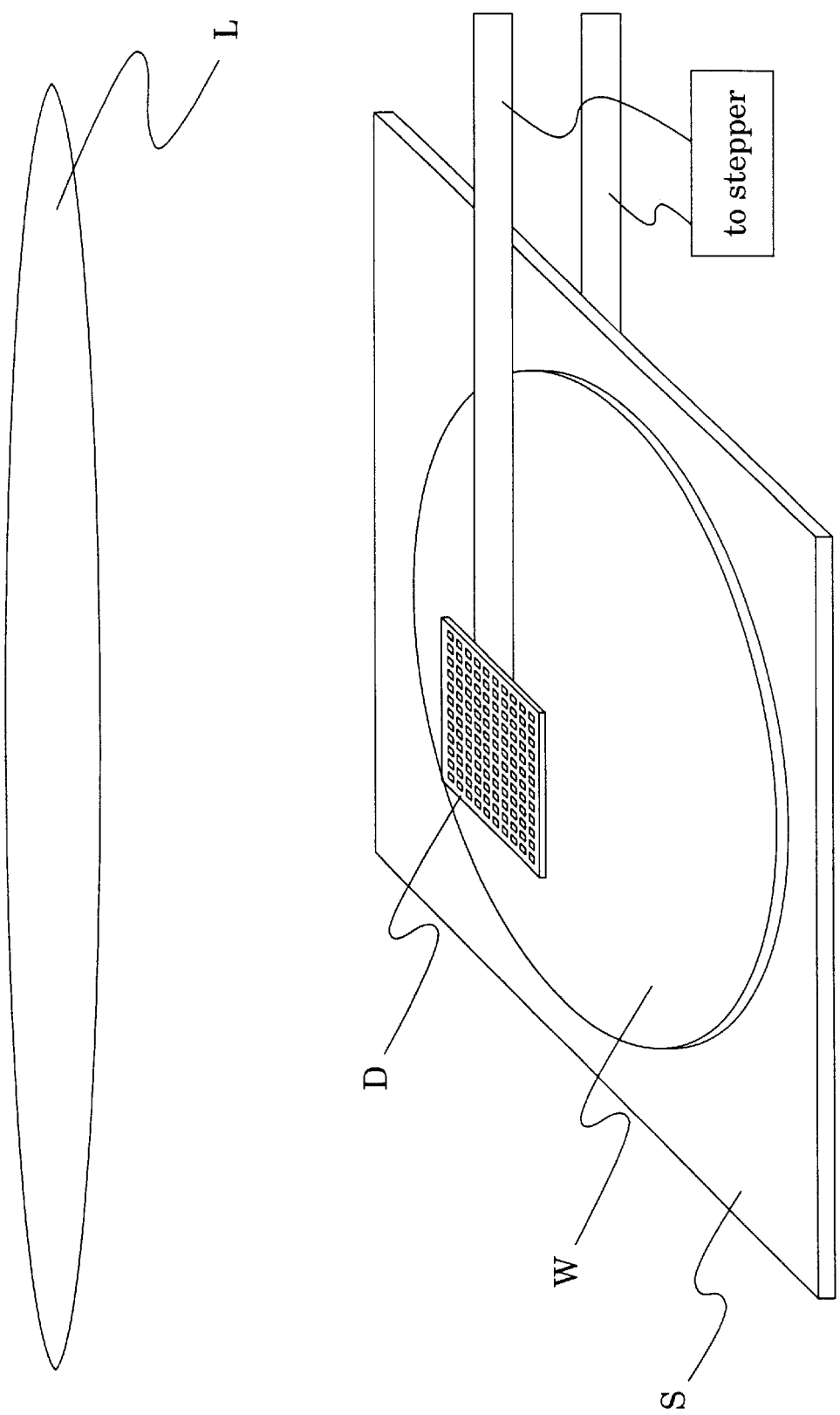
FIG. 7B shows a zoomed-in view of the diffraction limiter and wafer of FIG. 7A.

In order to utilize the programmable layer, PL, one must do a series of exposures of the photoresist 33. Between each exposure two actions can be taken: (a) any or all of the pixels 100 can be toggled to a new state, and/or (b) the substrate can be moved, if necessary. By selecting which pixels 100 to make opaque or transparent the manufacturer can generate any pattern that he or she desires. FIGS. 12A to 12H depict an example of this process using what we shall call a "4-step programmable layer." The term "4-step" means that in order to create a pattern that fills the entire area of the mask, the substrate must be exposed four times. Each step is shown in a different pair of figures, one representing a perspective view and the other representing a top view. For example, FIGS. 12A and 12B both depict the first exposure step, from differing views. In the example depicted, the printing of the desired pattern is completed in the last step, shown in FIGS. 12G and 12H. Another case would be if the programmable layer were designed such that the desired pattern could be printed without needing to move the substrate at all (similar to the setup in FIG. 7A). Lithography using this "1-step programmable layer" would act as a fully parallel process.

A light source, I, illuminates the programmable layer, PL, from above and the light transmitted 31 by the layer passes through a lens, L, and is demagnified. After demagnification, the image of the programmable layer, PL, impinges on the diffraction limiter 14 which is held in close proximity with a substrate coated with a photosensitive resist 33 as in FIG. 8. Light 31 is only transmitted through the diffraction limiter in transparent regions 30 and not through regions covered by opaque material 32, and thus exposes the resist in regions 35. The same setup is depicted in a more schematic way in FIG. 7A for purposes of clarity.

Figure 13A:
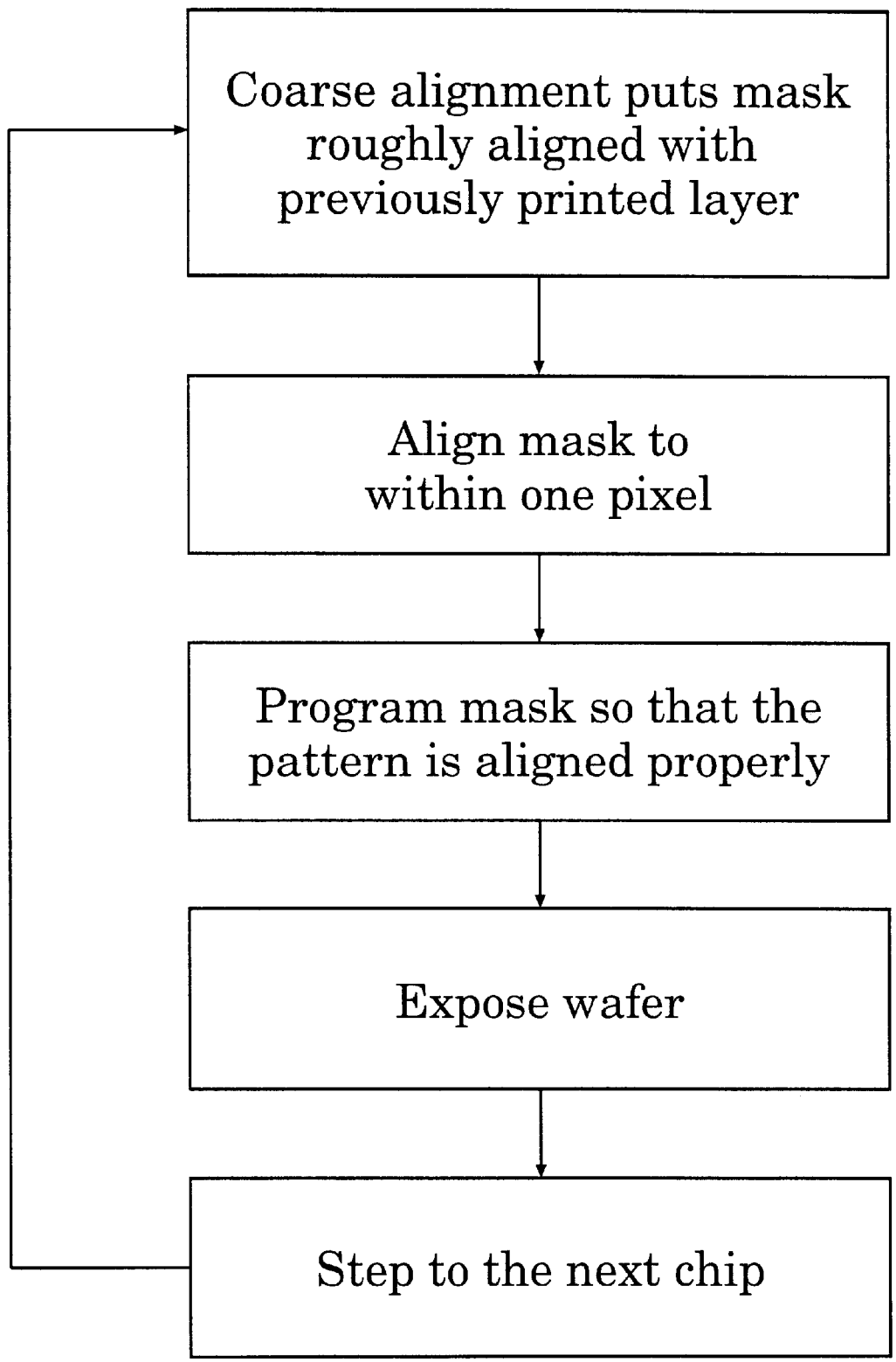
FIG. 13A summarizes an example electronic alignment technique in accordance with the present invention.
Figure 13F:
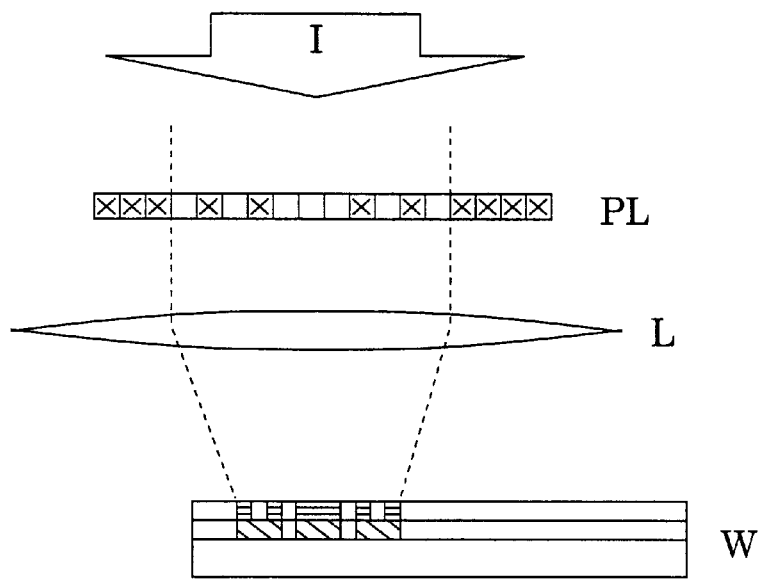
Figure 13G:
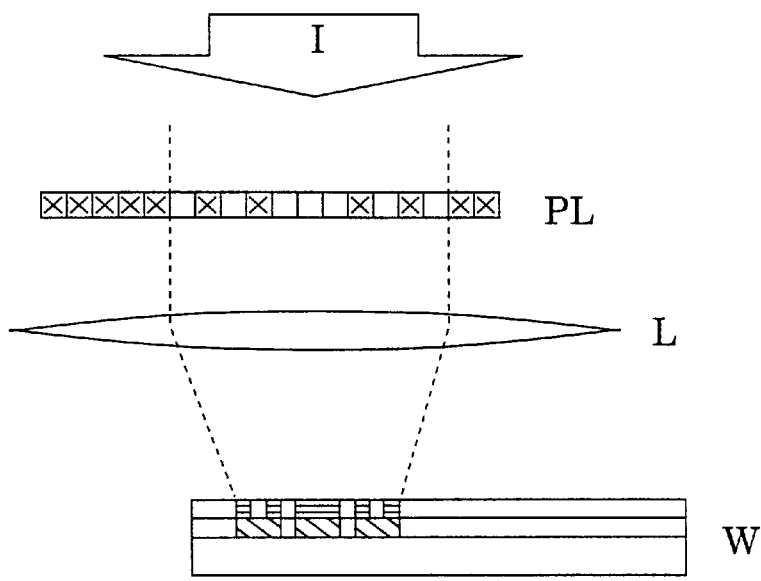

One example technique for electronic alignment is summarized in FIG. 13A. FIG. 13B shows a wafer, W, that has been previously processed. FIG. 13C shows the pattern that the user intends to add and its position relative to the previously processed features. FIG. 13D shows the programmable layer, PL, coarsely aligned with the wafer. At this stage, the programmable layer is not yet aligned to with a pixel, and if an exposure were made the resulting pattern would be misaligned with the previously processed features as in FIG. 13E. FIG. 13F shows the programmable layer after alignment to within a pixel, and the subsequent successful exposure. Given a different coarse alignment, FIG. 13G shows the case in which a different individual pixel in the programmable layer has been aligned with the previously processed features, and the subsequent successful exposure. FIGS. 13F–13G together demonstrate that the absolute location of the programmable layer relative to the wafer is not important as long as the programmable layer is aligned to within any single pixel. The pattern can be electronically shifted to a new set of pixels in the programmable layer such that they will project the image in the correct location.

Figure 14A:
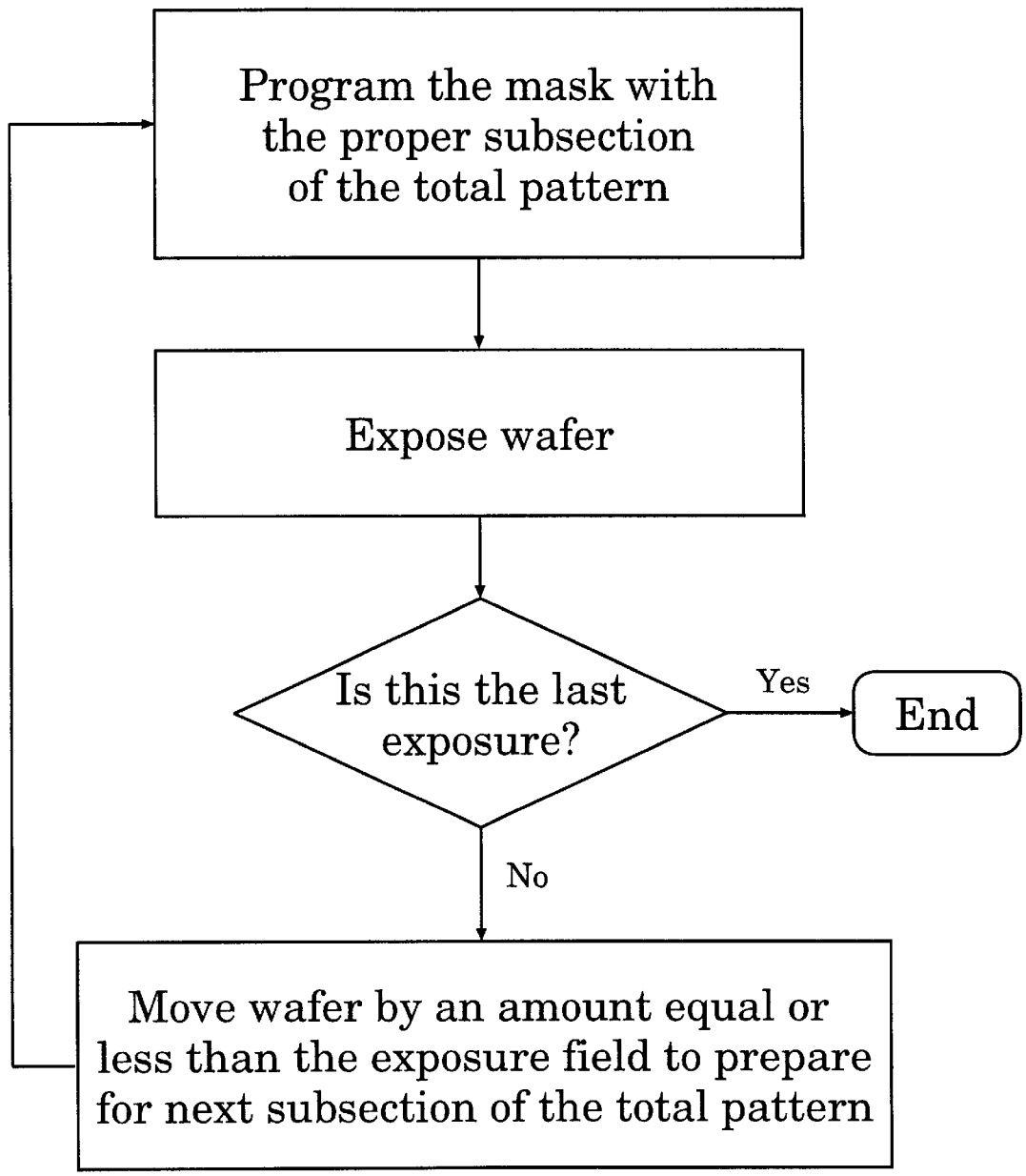
FIGS. 14A to 14F show an example technique in accordance with the present invention for printing chips that are larger than the exposure size of the mask.
Figure 14B:
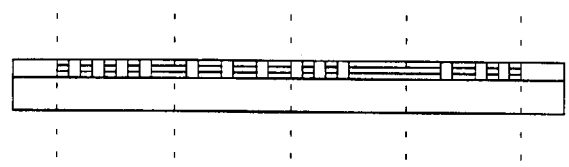
Figure 14C:
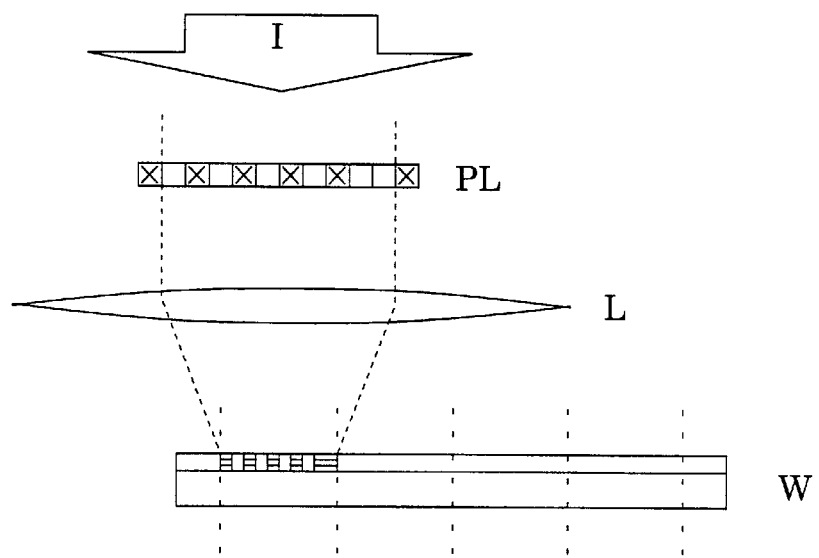
Figure 14D:
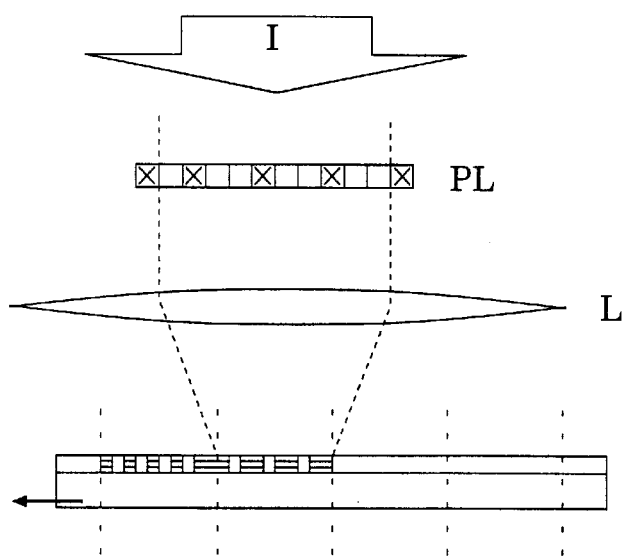
Figure 14E:
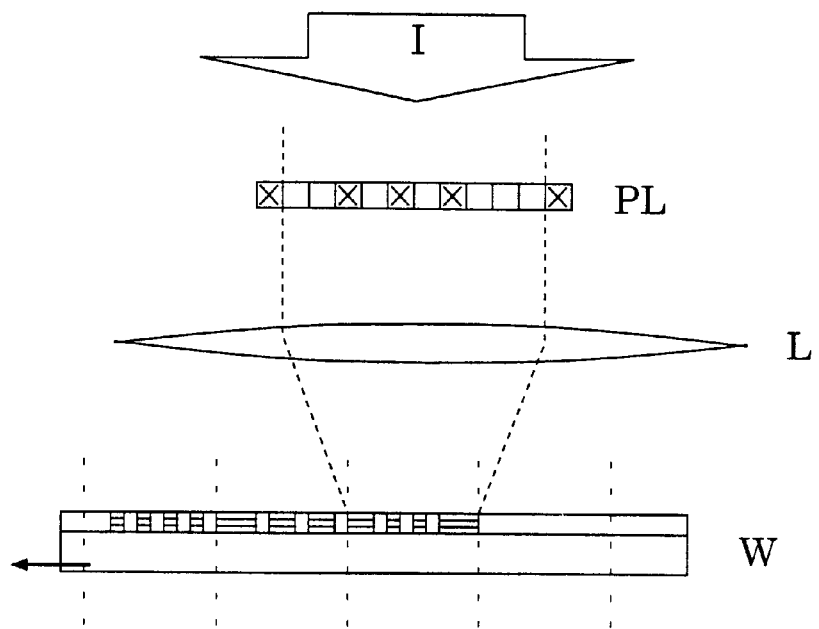
Figure 14F:
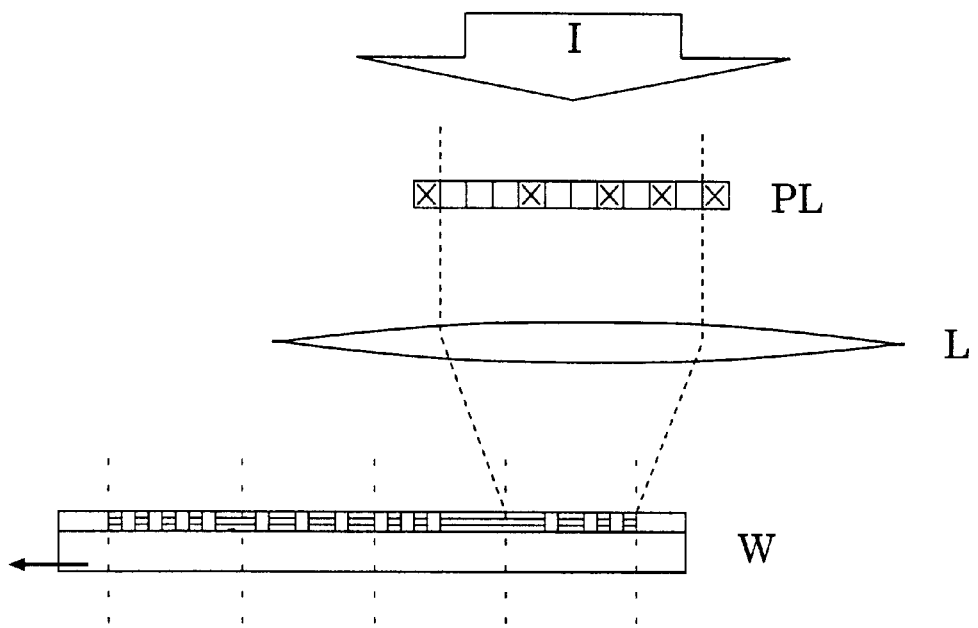

An example of how to use an example preferred embodiment ski provided in accordance with the present invention to disconnect the chip size from the exposure size is summarized in FIG. 14A. FIG. 14B shows the pattern that the user intends to print on the wafer, W. Note that this pattern is about four times the single exposure size of the programmable layer, PL. In each of the FIGS. 14C–14F, the programmable layer is loaded with the proper section of the total pattern, an exposure is made, and the wafer is moved to the left by a fixed amount. In FIG. 14F, the desired pattern has been printed.

Theory of Operation

We begin with a discussion of an example shutter in accordance with the present invention, followed by a discussion of an example selective amplifier in accordance with the present invention.

For the preferred embodiment array of shutters to work, it is necessary that the various shutters can be made either "transparent" or "opaque" to the incident light. For a mask, both terms "transparent" and "opaque" describe the ratio of the intensity of incident light to the intensity of transmitted light. An "opaque" material is different relative to a "transparent" material in that the amount of light attenuated is much greater in the case of the "opaque" material. The amount of attenuation is best measured using the concept of an attenuation coefficient, α, defined by the relation $$\frac{I}{I_o} = e^{-\alpha z}, \quad (1.)$$

where I is the transmitted intensity, $I_0$ is the incident intensity, and z is the thickness of material traversed. Using this, if we compare the transmitted intensities through a "transparent" material and an "opaque" material, we get a measure of the contrast in light impinging on the resist, C, as $$C = \frac{I_{transparent}}{I_{opaque}} = \frac{e^{-\alpha_{transparent} \cdot z}}{e^{-\alpha_{opaque} \cdot z}} = e^{+(\alpha_{opaque} - \alpha_{transparent}) \cdot z}. \quad (2.)$$

If this contrast is a large number, the resist will only be actively exposed when the shutter is in the "transparent"

state. Thus, if we can control the attenuation coefficient in a material, i.e. vary it from $\alpha_{transparent}$ to $\alpha_{opaque}$ SO that their difference is appreciable, then the system is a useful candidate for a programmable mask.

The attenuation coefficient, $\alpha$, arises from all possible mechanisms of absorption of the light combined. For our system, the two mechanisms we are most interested in are (a) absorption by "free" carriers in the conduction band, and (b) atomic/interband photoeffect.

Absorption by "Free" Carriers in the Conduction Band

In a simple classical model of conduction, the conductivity of a material is directly proportional to the number of free electrons per unit volume available to interact. These charges are capable of absorbing or reflecting the incident light. If the fields of the light are harmonic as $e^{i(\vec{k}\cdot\vec{x}-\omega t)}$ then we can write the wavevector as $$k = \beta + i\frac{\alpha}{2}, \quad (3.)$$

where $$\left.\begin{array}{c}\beta \\ \frac{\alpha}{2}\end{array}\right\} = \sqrt{\mu\varepsilon}\frac{\omega}{c}\left[\frac{\sqrt{1+\left(\frac{4\pi\sigma}{\omega\varepsilon}\right)^2}\pm 1}{2}\right]^{\frac{1}{2}}, \quad (4.)$$

where $\mu$ is the magnetic permeability, $\in$ is the dielectric constant, $\sigma$ is the conductivity of the material, c is the speed of light, and $\omega=E/\hbar$ is the circular frequency of the light.

Inserting Eq. (4.) into Eq. (3.), and using the $e^{i(\vec{k}\cdot\vec{x}-\omega t)}$ dependency, we see that the amplitude of the light incident in the z direction will drop off exponentially as $$e^{-\frac{\alpha z}{2}},$$

and hence the intensity will go as $e^{-\alpha z}$, verifying that $\alpha$ a is indeed the attenuation coefficient mentioned earlier. Hence, a change in the conductivity, $\sigma$, in Eq. (4.) will result in a corresponding change in the attenuation coefficient, $\alpha$.

Although the above classical treatment is not sufficient to describe the details of the interactions of photons with the conduction band electrons, the qualitative property of the conductivity affecting the absorption coefficient still holds true. For a more complete description, one must treat the system quantum mechanically. The next section deals with the quantum mechanical interaction of light with a solid.

Absorption Via Atomic/Interband Photoeffect

In this case, an electron absorbs an incident photon and is promoted to an excited state. If the energy of the light is insufficient to liberate it from the material completely (photoelectric knockout), then the electron must be promoted into another quantized state in the material. If such a state does not exist, the incident photon is not absorbed because energy cannot be conserved. Furthermore, if the state does exist but is already occupied by another electron (ignoring spin), the transition is also forbidden by the Pauli principle. If the transition is allowed, the probability that such an interband transition will occur can be written $$P_{if}(E_y) \, T_{if} g_f(E_f) g_i(E_i), \text{ with } E_f = E_i + E_y, \quad (5.)$$

where $T_{if}$ is the transition matrix element, $g_i(E_i)$ is the density of states initially occupied by electrons, and $g_f(E_f)$ is the density of unoccupied final states into which the electron may be promoted. The attenuation coefficient is proportional to this probability, $P_{if}$. Hence, if one can change either $g_i$ or $g_f$ then one can effectively make the material "transparent" or "opaque".

To illustrate how the absorption can be controlled in a shutter we now look to specific examples.

We will consider a Metal-Oxide-Semiconductor device ("MOS") as an example, but the discussion could also be applied to other structures such as p-n junctions, and even insulators. The region of interest will be in the semiconductor, near the interface with the oxide. The semiconductor has a band gap which we will choose to be 1 eV. In the intrinsic case, light with an energy less than 1 eV incident on the semiconductor is not able to promote electrons from the valence band to the conduction band. Hence, interband transitions will not contribute to the attenuation coefficient. The "free" electrons in the conduction band solely interact with the incident light. With this, if we consider the case where we dope the semiconductor as n-type (i.e. adding more free electrons to the conduction band), more light will be absorbed as we increase the dopant concentration (because there are more electrons interacting). For light energies less than the band gap, we will consider the material to then be "opaque" to the light, as the electrons in the conduction band absorb a significant amount of the incident intensity.

Next, if we apply a voltage to the MOS structure, we create a region near the interface in which the number of conduction band electrons is reduced compared to the non-biased case. Now we have a situation where the amount of light absorbed is less, because we have in effect changed the conductivity of the semiconductor in this depletion region. This situation is "transparent" relative to the aforementioned "opaque" setup. The actual materials used and the technique for creating the depletion region should be chosen in such a way to maximize the contrast, C, while keeping the actual transmitted intensity, $I_{transparent}$, as large as possible (so that the process takes as little time as possible.)

Another example would be to choose incident light with an energy just larger than the band gap energy. Then, interband transitions are likely to dominate the absorption. In the same n-type doped MOS structure as above, the density of unoccupied states in the conduction band, $g_f$, into which a valence band electron can be promoted is reduced near the bottom of the conduction band. This is due to the presence of a large concentration of electrons from the dopant atoms. Now, consider the situation in which we apply a voltage across the interface. This creates a depletion region in which there are fewer electrons present in the conduction band, and hence more unoccupied states. Comparing the biased and unbiased situations, one can see that the latter should be more "opaque" than the former, because more valence band electrons can be promoted into the newly vacated conduction band states. Once again, materials and voltages, etc . . . can be chosen to maximize both contrast and "transparent" intensity. Also, if we had used p-type doping rather than n-type, a corresponding change in $g_i$ would have appeared. Depleting the region of holes would have the same effect of toggling the state of the shutter. One should note that in the previously stated examples, the attenuation coefficient is only appreciably changed for a specific range of light energies, determined by properties such as but not limited to the choice of materials in the MOS structure, the bias supplied, and the dopant density. It should also be noted that this transition-blocking effect can work for photon energies corresponding to any transition within the material. For example, changing the density of unoccupied states in the conduction band, $g_f$, can affect the absorption of light (x-rays) on inner shell electrons in a material. Higher energies of light are desirable in lithography because the effects of diffraction are reduced as the light energy is increased.

Next, for the preferred embodiment array of selective amplifiers to work, it is necessary that the various selective amplifiers can be made either "amplifying" or "non-amplifying" to the incident light. For a mask, both terms "amplifying" and "non-amplifying" describe the ratio of the intensity of incident light to the intensity of output light. An "amplifying" state is defined relative to a "non-amplifying" state in that the amount of light at the output is much greater. Using this, if we compare the output intensities through an "amplifying" material and a "non-amplifying" material, we get a measure of the contrast in light impinging on the resist, C, as $$C = \frac{I_{amplifying}}{I_{non-amplifying}} = \frac{I_{amplifying}}{I_o}, \quad (6.)$$

where $I_{non-amplifying}$ is the incident intensity $I_0$, and $I_{amplifying}$ is the output intensity. The contrast is typically an increasing function of the thickness of the selective amplifier.

If this contrast is a large number, the resist will only be actively exposed when the selective amplifier is in the "amplifying" state. Thus, if we can control the amount of amplification in a material such that C is large, then the system is a useful candidate for use in a programmable mask.

The amplification occurs by a process known as stimulated emission. If an electron exists in a state that is an energy $\Delta E$ above another state, then when the electron drops (makes a transition) from the higher state to the lower state it will emit a photon with energy $\Delta E$. A photon with energy $\Delta E$ that passes near the electron in the excited state can cause the electron to drop to the lower state and emit a photon with the same energy, phase, and direction as the first photon. This is the process of stimulated emission. Stimulated emission is a well-known process and is the basis of the laser. In order for stimulated emission to occur, several conditions must be met. One condition is that there must be a population inversion. Ordinarily, electrons are in the lowest state available to them. When there are more electrons in an excited state than in the lower state then a population inversion exists. Another condition for stimulated emission is that there must be initial photons of the proper energy to cause the electrons to drop from the excited state.

In the preferred embodiment of the array of selective amplifiers, biasing the p-n junctions causes population inversions and the incident light provides the initial photons necessary for stimulated emission. The light that is shined on the biased p-n junctions is therefore amplified; the biased situation is the aforementioned "amplifying" state. The light that is incident on the unbiased p-n junctions is transmitted but not amplified. This allows the incident light to be selectively amplified by controlling which p-n junctions are biased. As long as there is appreciable amplification, and hence appreciable contrast, selective amplifiers can be useful in a lithography system.

Although the preferred embodiment describes a complex device that combines various components, each component in itself represents either a new technology or a great improvement upon existing technology. For example, an array of selective amplifiers or an array of shutters could be used as a stand-alone programmable structure, either with or without a diffraction limiter. Additionally, either type of array or a diffraction limiter could be implemented as part of any programmable lithography scheme.

Therefore, while the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

We claim:

1. A system for exposing a wafer comprising:
   a source of electromagnetic energy;
   at least one optical path between said source and said wafer;
   a programmable photolithographic mask comprising at least one two-dimensional array of structures disposed in an optical path between the wafer and the source of electromagnetic energy, at least some of said structures within said array comprising an active region supporting an electron distribution that can be programmably changed to affect the modulation of electromagnetic energy from said source; and
   a controller to control the active region electron distributions of said structures to interact with and selectively modulate, in accordance with a programmable two-dimensional pattern, electromagnetic energy from the source so as to provide a two-dimensional programmable exposure pattern of electromagnetic energy for exposing at least a part of the wafer.

2. A system as in claim 1 wherein at least some of the active regions comprise a material having a band gap.

3. A system as in claim 1 wherein at least some of the active regions comprise semiconductor material.

4. A system as in claim 1 wherein the controller includes a circuit that applies at least one of (a) a voltage, and (b) a current, to said structures.

5. A system as in claim 1 wherein the structures each comprise at least one of a PN junction semiconductor structure and a metal-insulating-semiconductor structure.

6. A system as in claim 1 wherein the controller controls said structures to selectively modulate the electromagnetic energy impinging on the wafer in accordance with a first pattern, and controls said structures to selectively modulate the electromagnetic energy impinging on the wafer in accordance with a second pattern different from the first pattern.

7. A system as in claim 6 wherein said controller exposes, in an overlayed manner, the same part of the wafer with said first and second patterns.

8. A system as in claim 6 further including a wafer stage, and wherein the controller controls the wafer stage to move the wafer between the first pattern exposure and the second pattern exposure.

9. A system as in claim 1 wherein said controller exposes different, adjacent regions of the wafer to provide an exposure pattern that is larger than the modulated electromagnetic energy pattern impinging on the wafer at any one time.

10. A system as in claim 1 wherein each of said structures comprises an electromagnetic energy shutter.

11. A system as in claim 10 wherein each of said structures further comprises an electromagnetic energy amplifier.

12. A system as in claim 1 wherein each of said structures comprises an electromagnetic energy amplifier.

13. A system as in claim 1 that further includes:
   an aligner that aligns at least one of said structures with a wafer feature;
   a position determiner that determines the position of said array relative to said wafer; and a pattern generator that programs said array to offset an exposure pattern within said array such that said exposure pattern is located correctly on said wafer.

14. A system as in claim 1 further including a diffraction limiter disposed between said array and said wafer.

15. The system of claim 1 wherein said system exposes patterns on the wafer corresponding to integrated circuits.

16. The system of claim 1 further including a controller that uses the two-dimensional array to repeatedly expose the wafer using a step-and-repeat operation.

17. The system of claim 1 further including a controller that controls said two-dimensional array to provide a selectable two-dimensional exposure pattern at each of plural exposures of the wafer.

18. The system of claim 1 further including a controller that exposes multiple layers of the wafer by re-using the same two-dimensional array of structures with different programming.

19. A system for producing an image in a photoresist using a two-dimensional electromagnetic energy exposure pattern developed from an electromagnetic energy source, the system comprising:
- a movable substrate stage that, in use, supports a substrate having a surface at least partially covered with photoresist;
- an optical path that directs electromagnetic energy from said electromagnetic energy source towards a programmable photolithographic mask, said programmable photolithographic mask comprising a two-dimensional array of semiconductor structures, said semiconductor structures each comprising an active region supporting an electron distribution that can be programmably changed; and
- a controller that electrically controls the electron distribution within the structures to interact with and modulate the electromagnetic energy from the source, to define a desired programmable two-dimensional microfabrication exposure pattern of electromagnetic energy that impinges on the substrate, thereby exposing the photoresist with said two-dimensional microfabrication exposure pattern of electromagnetic energy.

20. The system of claim 19 wherein said system exposes patterns on the wafer corresponding to integrated circuits.

21. The system of claim 19 further including a controller using the two-dimensional array to repeatedly expose the substrate using a step-and-repeat operation.

22. The system of claim 19 further including a controller that controls said two-dimensional array to provide a selectable two-dimensional exposure pattern at each of plural exposures of the substrate.

23. The system of claim 19 further including a controller that exposes multiple layers of the substrate by re-using the same two-dimensional array of structures with different programming.

24. The system of claims 19 wherein said substrate comprises a semiconductor wafer.

25. A system for exposing a wafer using a source of electromagnetic energy comprising:
- an array of structures that, in use, is illuminated by said electromagnetic energy from said source;
- said array creating a pattern with said structures, said structures interacting with and amplifying at least a portion of the incident electromagnetic energy to thereby create and form said pattern through said amplification, said array of structures outputting to said wafer, said amplified electromagnetic energy corresponding to said pattern.

26. A system as in claim 25 wherein said array of structures has first and second regions each comprising an active region supporting an electron distribution that can be changed.

27. A system for exposing a wafer with a source of electromagnetic energy comprising:
- a programmable photolithographic mask that, in use, is illuminated by electromagnetic energy from said source, said mask comprising at least a first region having a first electron distribution and a second region having a second electron distribution that is different from the first electron distribution;
- said first region electron distribution and said second region electron distribution interacting with and modulating at least a portion of the incident electromagnetic energy to create a programmable two-dimensional electromagnetic energy exposure pattern, and said mask outputting toward said wafer masked electromagnetic energy corresponding to said two-dimensional electromagnetic energy exposure pattern.

28. A system as in claim 27 wherein said first region has a different doping level than the second region.

29. A system as in claim 27 wherein said mask comprises a material with a band gap.

30. A system as in claim 27 wherein said mask comprises a semiconductor material.

31. A system as in claim 27 wherein electromagnetic transmissivity of said first region and said second region are substantially permanently defined.

32. The system of claim 27 wherein said system exposes patterns on the wafer corresponding to integrated circuits.

33. The system of claim 27 further including a controller that uses the programmable photolithographic mask to repeatedly expose the wafer using a step-and-repeat operation.

34. The system of claim 27 further including a controller that controls said programmable photolithographic mask to provide a selectable two-dimensional exposure pattern at each of plural exposures of the wafer.

35. The system of claim 27 further including a controller that exposes multiple layers of the wafer by re-using the same programmable photolithographic mask of structures with different programming.

* * * * *